United States Patent
Yamaoka

[19]

[11] Patent Number: 6,166,572
[45] Date of Patent: Dec. 26, 2000

[54] VOLTAGE-CONTROLLED DELAY LINE, DIRECT PHASE CONTROLLED VOLTAGE-CONTROLLED OSCILLATOR, CLOCK/DATA RECOVERY CIRCUIT, AND CLOCK/DATA RECOVERY APPARATUS

[75] Inventor: Nobusuke Yamaoka, Tokyo, Japan

[73] Assignee: Oki Electric Industry Co., Ltd., Tokyo, Japan

[21] Appl. No.: 09/040,451

[22] Filed: Mar. 18, 1998

[30] Foreign Application Priority Data

Jun. 13, 1997 [JP] Japan ..................................... 9-156515

[51] Int. Cl.$^7$ ........................................................ H03L 7/07
[52] U.S. Cl. ........................... 327/149; 327/150; 327/153; 327/158; 327/159; 327/270; 327/271; 375/327; 375/328; 375/375; 375/376
[58] Field of Search ..................................... 375/376, 377, 375/371, 373, 375, 327, 328, 354; 327/270, 276, 269, 271, 272, 284, 299, 141, 144, 146, 147, 149, 150, 155, 156, 153, 161, 162

[56] References Cited

U.S. PATENT DOCUMENTS

| | | | |
|---|---|---|---|
| 5,179,438 | 1/1993 | Morimoto | 358/17 |
| 5,355,037 | 10/1994 | Andersen et al. | 307/602 |
| 5,428,309 | 6/1995 | Yamauchi et al. | 327/158 |
| 5,473,610 | 12/1995 | Rainard | 370/94.2 |
| 5,638,019 | 6/1997 | Frankeny | 327/295 |
| 5,646,564 | 7/1997 | Erickson et al. | 327/158 |
| 5,712,583 | 1/1998 | Frankeny | 327/158 |
| 5,719,514 | 2/1998 | Sato | 327/262 |
| 5,838,204 | 11/1998 | Yao | 331/1 R |
| 5,901,190 | 5/1999 | Lee | 375/373 |
| 5,963,074 | 10/1999 | Arkin | 327/276 |

OTHER PUBLICATIONS

Dao–Long Chen, "A Power and Area Efficient CMOS Clock/Data Recovery Circuit for High–Speed Serial Interfaces", IEEE Journal of Solid–State Circuits, Aug. 1996, pp. 1171–1176.

*Primary Examiner*—Stephen Chin
*Assistant Examiner*—Dac V. Ha
*Attorney, Agent, or Firm*—Venable; Robert J. Frank; Michael A. Sartori

[57] ABSTRACT

A clock/data recovery device employs a phase-locked loop that supplies a single clock signal and a control voltage signal to at least one clock/data recovery circuit. The clock/data recovery circuit has a voltage-controlled delay line or direct phase controlled voltage-controlled oscillator that generates a multiple-phase clock signal, which is used to recover a clock signal and data from a received data signal. The voltage-controlled delay line or direct phase controlled vottage-controlled oscillator has a cascade or ring of voltage controlled logic gates, with propagation delays controlled by the control voltage signal from the phase-locked loop, and additional logic gates that supply the clock signal from the phase-locked loop to a selectable one of the voltage-controlled logic gates.

29 Claims, 18 Drawing Sheets

VOLTAGE-CONTROLLED DELAY LINE, DIRECT PHASE CONTROLLED VOLTAGE-CONTROLLED OSCILLATOR, CLOCK/DATA RECOVERY CIRCUIT, AND CLOCK/DATA RECOVERY APPARATUS

BACKGROUND OF THE INVENTION

The present invention relates to a voltage-controlled delay line, a voltage-controlled oscillator with direct phase control, a clock/data recovery circuit, and a clock/data recovery apparatus suitable for use in an integrated circuit.

In the past, analog phase-locked loop (PLL) technology has been used to recover a clock signal from a received data signal. The recovered clock signal is generated by a voltage-controlled oscillator (VCO), and is synchronized with the data signal by comparing the phases of the clock signal and data signal, the phase of the data signal being indicated by transitions in the data value. A problem with this technique is that synchronization may be lost if there are no data transitions for an extended time.

In recent years, analog technology has been combined with digital technology to create clock recovery circuits that overcome this problem. In one type of circuit, an analog PLL locked to a stable system reference clock is used to generate a multiple-phase clock signal. Digital circuitry then selects one of the multiple phases that correctly samples the received data signal.

In apparatus receiving data on two or more channels in parallel, the same multiple-phase clock signal can in theory be shared, the appropriate phase being selected for each channel separately. Unfortunately, supplying a multiple-phase clock to many different receiving circuits requires much interconnection wiring, because each phase of the multiple-phase clock is a separate signal. In an integrated circuit, the large number of clock signal lines can create layout and routing problems. Moreover, it is not easy to maintain the correct phase relationships among the different clock phases. Some channels may consequently be supplied with badly skewed multiple-phase clock signals, and experience problems in receiving data correctly.

SUMMARY OF THE INVENTION

It is accordingly an object of the present invention to reduce the amount of interconnection wiring necessary for supplying clock signals to clock/data recovery circuits.

Another object of the invention is to eliminate clock skew in clock/data recovery circuits.

Another object is to provide smooth and gradual transitions between different recovered clock phases.

Another object is to obtain a recovered clock signal with a fifty-percent duty cycle.

Another object is to reduce the power dissipation of clock/data recovery circuits.

The invented voltage-controlled delay line comprises a first cascaded series of first logic gates with voltage-controlled propagation delays, and a plurality of second logic gates, one second logic gate coupled to every M-th first logic gate in the first cascaded series, where M is a positive integer. The propagation delays of the first logic gates are controlled in common by a control voltage signal. The second logic gates receive an input clock signal. A phase selection signal selects one of the second logic gates, which supplies the input clock signal to the corresponding first logic gate. A delayed clock signal is obtained from the last logic gate in the first cascaded series.

The invented voltage-controlled delay line may also have a second cascaded series of third logic gates with voltage-controlled propagation delays, likewise controlled by the control voltage signal, and equal to the propagation delays of the first logic gates. The second cascaded series of third logic gates receives the delayed clock signal and generates a multiple-phase clock signal with an odd number of phases.

The invented direct phase controlled voltage-controlled oscillator comprises a plurality of first logic gates coupled in a ring, and a plurality of second logic gates coupled to respective first logic gates. The first logic gates have voltage-controlled propagation delays, which are controlled in common by a control voltage signal. The second logic gates receive an input clock signal. A phase selection signal selects one of the second logic gates, which supplies the input clock signal to the corresponding the first logic gate. The first logic gates operate as a ring oscillator synchronized to the supplied input clock signal. A multiple-phase clock signal with an odd number of phases can be obtained from the output terminals of an odd number of the first logic gates.

The second logic gates in the invented voltage-controlled delay line and direct phase controlled voltage-controlled oscillator may also have voltage-controlled propagation delays. In this case, each second logic gate has a delay switching circuit that provides a control voltage responsive to the control voltage signal and a delay switching signal. The propagation delays of the second logic gates can thereby be switched between a first value and a second value, the first value being a minimum value, and the second value being a certain multiple of the propagation delays of the first logic gates. Transitions between the first value and said second value are made gradually over a certain transient response interval.

The invented clock/data recovery circuit comprises the invented voltage-controlled delay line or the invented direct phase controlled voltage-controlled oscillator, outputting a multiple-phase clock signal; a data phase monitor receiving the multiple-phase clock signal and a received data signal; and a controller. The data phase monitor provides the middle phase of the multiple-phase clock as a recovered clock signal; provides, as recovered data, samples of the received data signal taken at sampling timings determined by the middle phase; compares transitions of the received data signal with the multiple-phase clock signal; and outputs an advance signal or a delay signal when the received data transitions approach the sampling timings. The controller controls the phase selection signal according to the advance and delay signals, thereby shifting the phase of the multiple-phase clock signal and moving the sampling timings move away from the transitions of the received data signal.

If the second logic gates have voltage-controlled propagation delays, the controller also controls the delay switching signal, so that changes in the phase of the multiple-phase clock signal are made smoothly and gradually.

The invented clock/data recovery apparatus comprises at least one clock/data recovery circuit of the invented type, and a phase-locked loop. The phase-locked loop has a loop filter that generates the control voltage signal, and a voltage-controlled ring oscillator that generates the input clock signal supplied to the voltage-cointrolled delay line or direct phase controlled voltage-controlled oscillator in the clock/data recovery circuit. The ring oscillator in the phase-locked loop comprises a plurality of fourth logic gates with voltage-controlled propagation delays, which are controlled by the control voltage signal. The first logic gates, third logic gates, and fourth logic gates are preferably all of the same type.

The invented clock/data recovery apparatus may also have a pulse-deleting frequency divider coupled between the phase-locked loop and the clock/data recovery circuit, to reduce the frequency of the input clock signal by deleting clock pulses, thereby reducing the operating frequency of the controller and decreasing its power dissipation.

The amount of interconnection wiring in the invented apparatus is reduced, because the phase-locked loop is coupled to the clock/data recovery circuit by only a single clock signal line and a single control voltage signal line. Clock skew does not occur, because the multiple-phase clock signal is generated locally in the clock/data recovery circuit. When the clock/data recovery circuit employs the invented direct phase controlled voltage-controlled oscillator, a recovered clock signal with a fifty-percent duty cycle can be obtained even if the duty cycle of the input clock signal received by the clock/data recovery circuit is not fifty percent.

DETAILED DESCRIPTION OF THE INVENTION

Embodiments of the invention will be described with reference to the attached exemplary drawings.

First Embodiment

Figure 1:
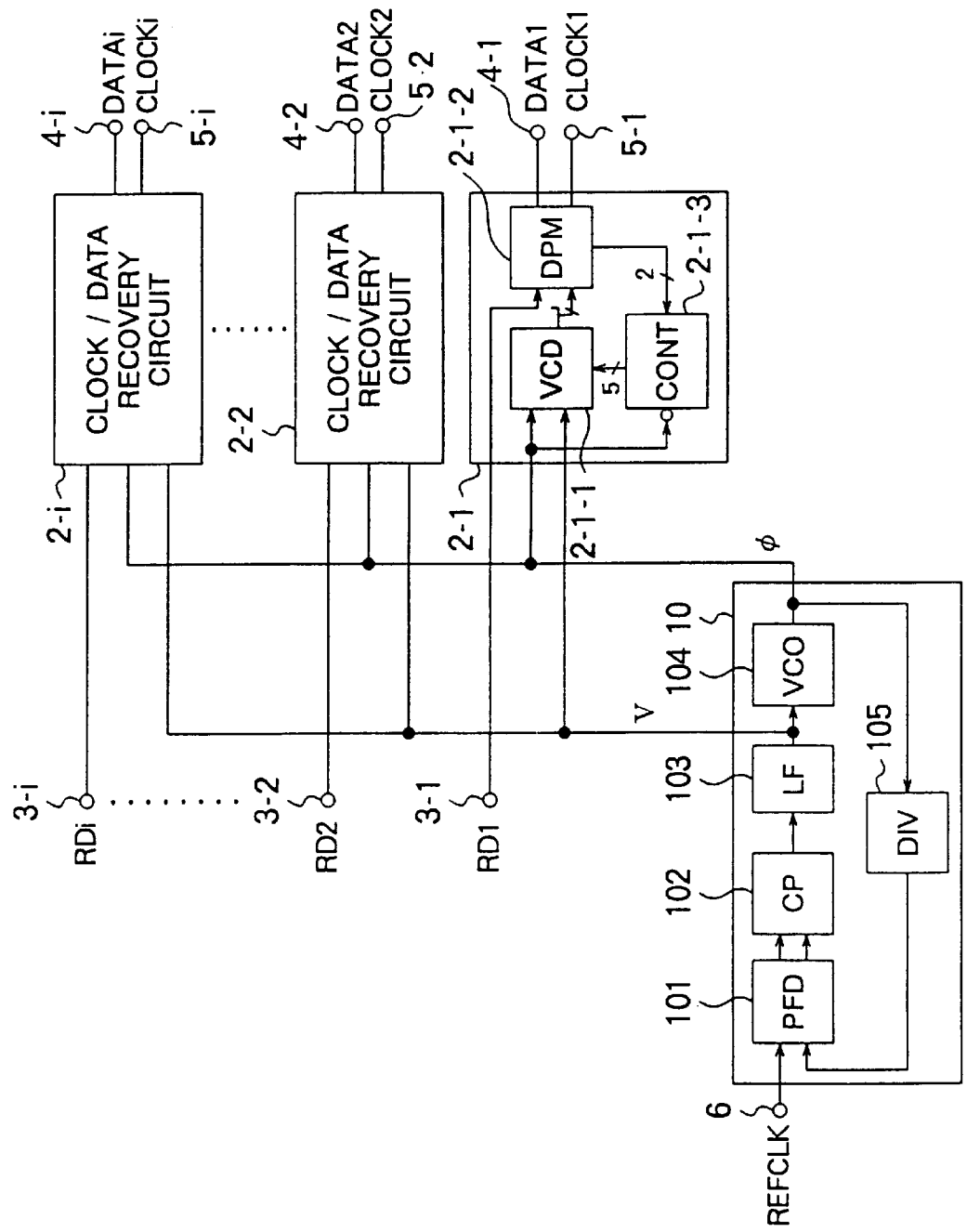
FIG. 1 is a block diagram or a clock/data recovery apparatus according to a first embodiment of the invention.

As a first embodiment of the invention, FIG. 1 shows a clock/data recovery apparatus with i channels, where i is an arbitrary positive integer. The apparatus has i clock/data recovery circuits 2-1 to 2-i with corresponding received data signal input terminals 3-1 to 3-i, recovered data output terminals 4-1 to 4-i, and recovered clock output terminals 5-1 to 5-i. The apparatus also has a reference clock input terminal 6. The reference clock signal (REFCLK) is multiplied in Frequency by a PLL 10 to generate a clock signal $\phi$, which is supplied as an input clock signal to the clock/data recovery circuits 2-1 to 2-i. The frequency of the clock signal $\phi$ is substantially equal to the bit rate of the received data signals RD1 to RDi. The PLL 10 also supplies the clock/data recovery circuits 2-1 to 2-i with a control voltage V.

The reference clock signal is, for example, a system clock signal used in a data-processing system of which the clock/data recovery apparatus in FIG. 1 forms one part. The reference clock signal is assumed to be stable. Typically, the system reads the data recovered by the clock/data recovery apparatus at times designated by the reference clock signal, the recovered data having in the meantime been converted from serial to parallel form.

Next, a description of the internal structure of the PLL 10 will be given.

The PLL 10 comprises a phase/frequency detector (PFD) 101, charge pump (CP) 102, loop filter (LF) 103, voltage-controlled oscillator (VCO) 104, and divider (DIV) 105. If the frequency of the reference clock signal (REFCLK) is equal to the bit rate of the received data signals RD1 to RDi, the divider 105 can be omitted.

The phase/frequency detector 101 compares the reference clock signal with the divided clock signal output by the divider 105. If the divided clock signal needs to be speeded up or slowed down in order to match the phase and frequency of the reference clock signal, the phase/frequency detector 101 outputs a corresponding up signal or down signal. The up and down signals are, for example, pulse signals in which the pulse width corresponds to the amount by which the divided clock signal needs to be speeded up or slowed down.

The charge pump 102 maintains an internal charge potential which is plumped up by the tip signal, and pumped down by the down signal. This potential is output to the loop filter 103, which is a low-pass filter that integrates and thereby smoothes the waveform received from the charge pump 102. The smoothed waveform is the control voltage V, which is supplied to the VCO 104 as well is to the clock/data recovery circuits 2-1 to 2-i.

The VCO 104 oscillates at a frequency controlled by the control voltage V. The frequency at the center of the control range corresponds to the nominal bit rate of the received data signals. If the control voltage V departs from the center value, the VCO 104 oscillates at a higher or lower frequency. The VCO 104 generates the clock signal $\phi$, which is supplied to the divider 105 as well as to the clock/data recovery circuits 2-1 to 2-i.

The divider 105 divides the frequency of the clock signal $\phi$ by a positive integer N, thereby producing the divided clock signal, which has a frequency substantially equal to the frequency of the reference clock signal REFCLK. The PLL 10 keeps the clock signal $\phi$ locked to N times the frequency of the reference clock signal, with a fixed phase relationship between the two clock signals. Any changes in the phase or frequency of the reference clock signal are tracked at a rate determined by the time constant of the loop filter 103.

Figure 2:
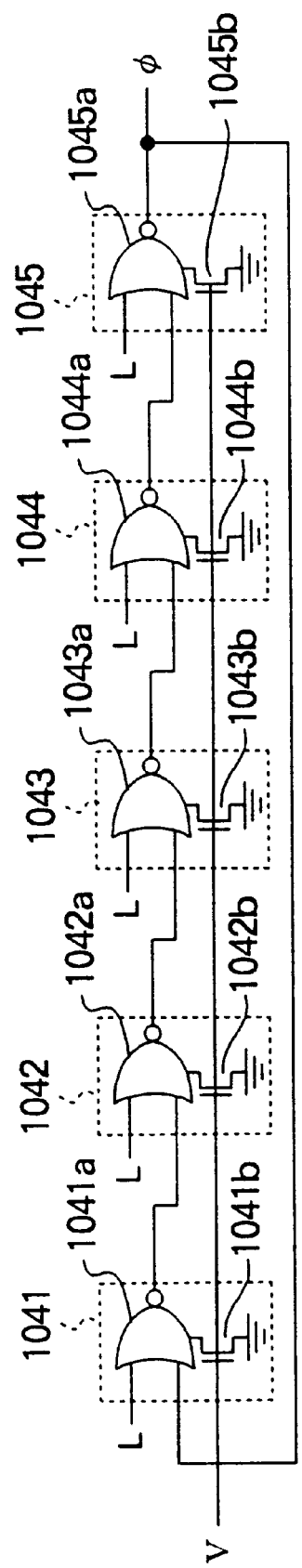
FIG. 2 is a more detailed block diagram of a voltage-controlled oscillator used in the first embodiment.

FIG. 2 shows the internal structure of the VCO 104. The VCO 104 is a five-stage ring oscillator comprising five voltage-controlled NOR gates 1041 to 1045. The number of stages is not limited to five, but must be an odd number not less than three. The number of stages can be determined according to the number of clock phases generated in the clock/data recovery circuits, as described later.

Each of the voltage-controlled NOR gates 1041 to 1045 has a NOR logic circuit (1041a to 1045a) comprising, for example, field-effect transistors coupled in a well-known configuration. One of the input terminals of the NOR logic circuit is held at the low logic level, so that the NOR logic circuit operates as an inverter. The other input terminal is coupled to the output terminal of the preceding NOR gate in the ring.

The voltage-controlled NOR gates 1041 to 1045 also have delay control transistors 1041b to 1045b) that control the propagation delays or the NOR gates. These delay control transistors 1041b to 1045b are inserted in series between the NOR logic circuits 1041a to 1045a and ground. The gate electrodes of the delay control transistors 1041b to 1045b are held at the potential of the control voltage V; the delay control transistors operate as constant-current sources. The control voltage V controls the oscillation frequency of the ring oscillator by controlling the bias current supplied to the NOR logic circuits.

The clock signal $\phi$ is taken from the output terminal of one of the voltage-controlled NOR gates; in the drawing, from NOR gate 1045. The total round-trip) propagation delay of the ring oscillator corresponds to one half cycle of the clock signal $\phi$.

Next, the internal structure of the first clock/data recovery circuit 2-1 will be described. The other clock/data recovery circuits 2-2 to 2-i are have similar internal structures.

Referring again to FIG. 1, The first clock/data recovery circuit 2-1 comprises a voltage-controlled delay line (VCO) 2-1-1, a data phase monitor (DPM) 2-1-2, and a controller (CONT) 2-1-3.

The voltage-controlled delay line 2-1-1 receives the clock signal $\phi$ and control voltage V provided by the PLL 10, and a five-bit. phase selection signal provided by the controller 2-1-3. The voltage-controlled delay line 2-1-1 delays the input clock signal $\phi$ by an amount selected by the phase selection signal, and by additional amounts that generate a three-phase clock signal, comprising clock signals $\psi 1$, $\psi 2$, and $\psi 3$. The difference in phase between $\psi 1$, $\psi 2$, and $\psi 3$ is equal to, for example, one-fifth of one cycle of the input clock signal $\phi$. In this case the delay amounts selected by the phase selection signal should be substantially equal to $1/5$, $2/5$, $3/5$, $4/5$, and $5/5$ of the cycle length of clock signal $\phi$.

The first embodiment is not restricted to the above delay values. The delays can be determined according to the number of stages in the ring oscillator used as the VCO 104 in the PLL 10.

Figure 3:
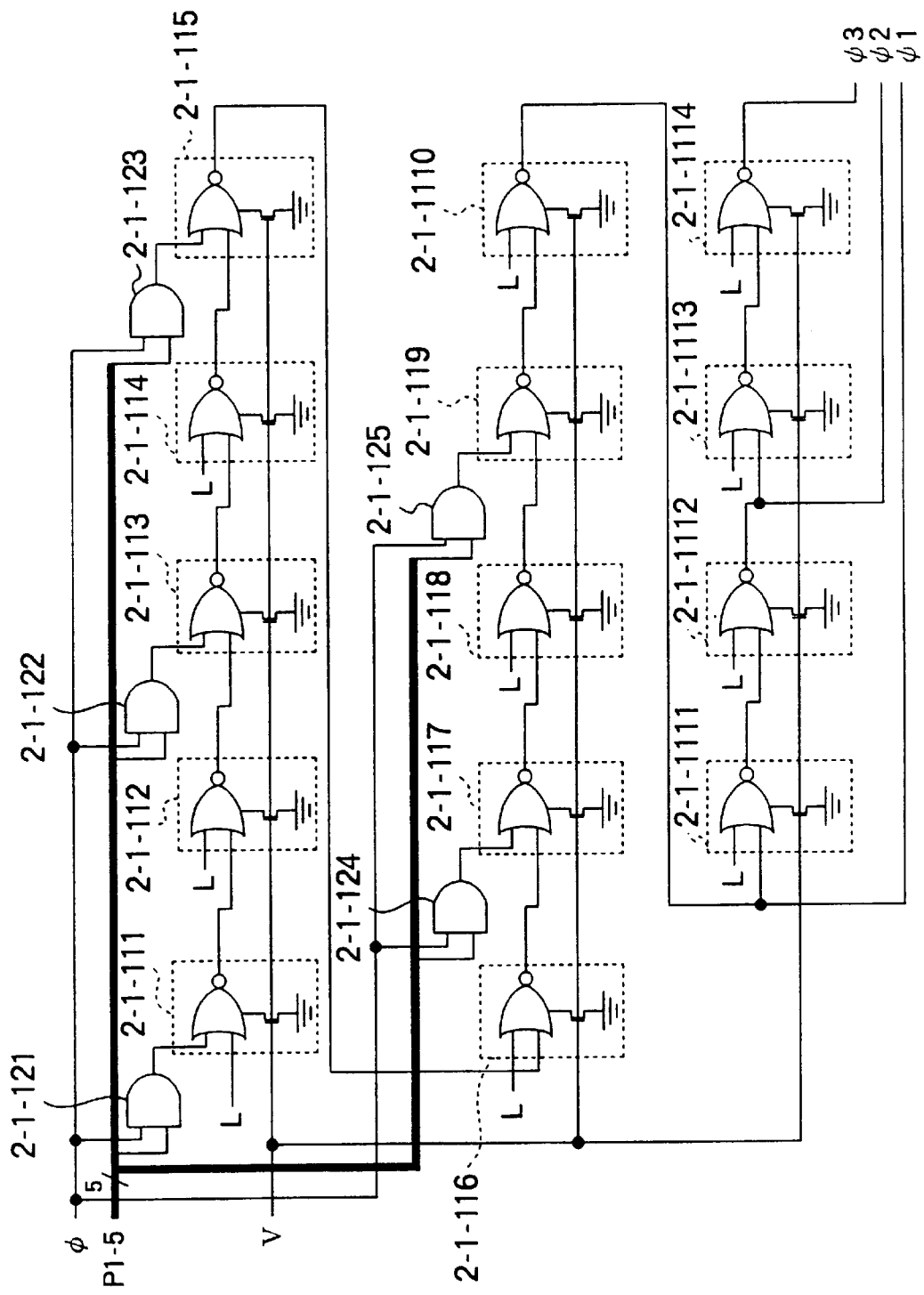
FIG. 3 is a more detailed block diagram of a voltage-controlled delay line used in the first embodiment.

Referring to FIG. 3, the voltage-controlled delay line 2-1-1 comprises fourteen voltage-control led NOR gates, numbered 2-1-111 to 2-1-119 and( 2-1-1110 to 2-1-1114, and five AND gates 2-1-121 to 2-1-125. The voltage-controlled NOR gates in the voltage-controlled delay line 2-1-1 have the same configuration as the voltage-controlled NOR gates in the VCO 104 in the PLL 10, each comprising a NOR logic circuit and a delay control transistor (reference numerals omitted). The control voltage V obtained from the PLL 10 is applied to the gate electrodes of the delay control transistors in all of the voltage-controlled NOR gates 2-1-111 to 2-1-1114, and controls their propagation delays.

Use of the same control voltage V in both the VCO 104 and the voltage-controlled delay line 2-1-1 enables the phase of the three-phase clock signal to be controlled in steps equal to an integer sub-multiple of the clock cycle, so that the phase can wrap around the clock cycle cleanly, as described later.

The five bits of the phase selection signal, denoted P1 to P5 (P1–5), are supplied to respective AND) gates 2-1-121 to 2-1-125. These AND gates also receive the input clock signal $\phi$. Each AND gate outputs the clock signal $\phi$ when the corresponding bit of the phase selection signal is high, and has a fixed low output when the corresponding bit of the phase selection signal is low. The propagation delays of the AND gates 2-1-121 to 2-1-125 are negligible in comparison to the propagation delays of the voltage-controlled NOR gates 2-1-111 to 2-1-1114.

The voltage-controlled NOR gates 2-1-111 to 2-1-1114 are coupled in cascade, the output terminal of each NOR gate except the last being coupled to one of the input terminals of the next NOR gate in the cascaded series. The other input terminals of the first, third, fifth, seventh, and ninth voltage-controlled NOR gates 2-1-111, 2-1-113, 2-1-115, 2-1-117, and 2-1-119 receive the outputs of AND gates 2-1-121, 2-1-122, 2-1-123, 2-1-124, and 2-1-125, respectively. The other input terminals of the even-numbered NOR gates, and of NOR gates 2-1-1111 and 2-1-1113, are held at the low logic level. The clock signals $\psi 1$, $\psi 2$, and $\psi 3$ are taken from the output terminals of the tenth, twelfth, and fourteenth NOR gates 2-1-1110, 2-1-1112, and 2-1-1114, respectively.

If the first bit of the five-bit phase selection signal is high and the other bits are Low, then the input clock signal $\phi$ is supplied through the first AND gate 2-1-121, and the outputs of the other AND gates are held low. Clock signal $\phi$ passes wi th negligible delay through AND gate 2-1-121, is delayed and inverted by each of the first ten voltage-controlled NOR gates 2-1-111 to 2-1-1110, and is output as clock signal $\psi 1$ From the tenth NOR gate 2-1-1110, with a total delay of substantially one (5/5) full cycle.

Similarly, if the second bit of the phase selection signal is high and the other bits are low, then the input clock signal $\phi$ passes through the second AND gate 2-1-122, is delayed and inverted by eight voltage-controlled NOR gates 2-1-113 to 2-1-1110, and is output from the tenth voltage-controlled NOR gate 2-1-1110 with a delay of substantially four-fifths (4/5) of one full cycle as the clock signal $\psi 1$. In this case the third NOR gate 2-1-113 acts as an inverter because the output of the second NOR gate 2-112 is low. The output of the second NOR gate 2-1-112 is low because the output of the first AND gate 2-1-121 is low, making the output of the first NOR gate 2-1-111 high.

A delay of substantially 3/5, 2/5, or 1/5 cycle is generated in like manner when the third, fourth, or fifth bit of the phase selection signal is high, if the other bits are low.

The last four voltage-controlled NOR gates 2-1-1111 to 2-1-1114 delay the phases of clock signals $\psi 2$ and $\psi 3$ by one-fifth and two-fifths of a cycle, respectively, with respect to $\psi 1$. Clock signal $\psi 1$ will be referred to below as the advanced phase, $\psi 2$ as the middle phase, and $\psi 3$ as the delayed phase.

Since these last four voltage-controlled NOR gates, and the even-numbered NOR gates 2-1-112, 2-1-114, 2-1-116, 2-1-118, and 2-1-1110, always operate as inverters, these NOR gates could be replaced by voltage-controlled inverters. It is preferable to use voltage-controlled NOR gates with one input tied low, however, so that these gates will have the same propagation delay characteristics as the other voltage-controlled NOR gates in the voltage-controlled delay line 2-1-1. This is also the reason why voltage-controlled NOR gates, instead of inverters, are used in the VCO 104. A further advantage is that using the same type of gate throughout simplifies the integrated-circuit design and fabrication processes.

Referring again to FIG. 1, the data phase monitor 2-1-2 receives a data signal RD1, which is a serial data signal, from data input terminal 3-1, and receives the three-phase clock output by the voltage-controlled delay line 2-1-1. The data phase monitor 2-1-2 has three functions. The first function is simply to output the middle phase $\psi 2$ of the three-phase clock signal at the clock output terminal 5-1 as the recovered clock signal. The second function is to sample the received data signal RD1 at timings determined by the middle phase $\psi 2$, and supply the samples to the data output terminal 4-1 as recovered data. The third function is to compare transitions in the received data signal with the three-phase clock signal, and output an advance signal or a delay signal if the received data transitions approach the sampling timings determined by the middle phase $\psi 2$.

Figure 4:
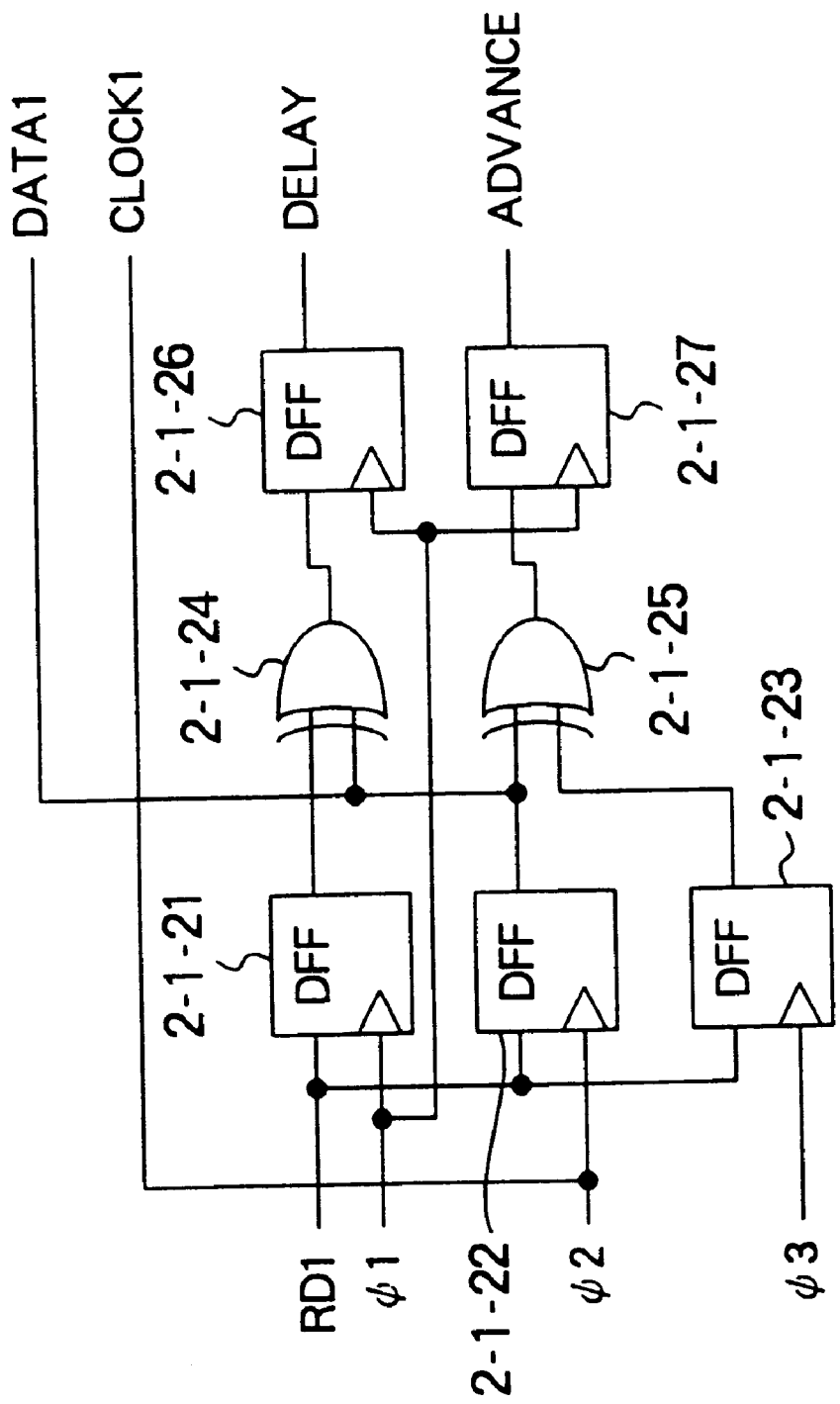
FIG. 4 is a more detailed block diagram of a data phase monitor used in the first embodiment.

Referring to FIG. 4, the data phase monitor 2-1-2 comprises five D-type flip-flops (DFFs) 2-1-21, 2-1-22, 2-1-23, 2-1-26, and 2-1-27, and two exclusive-OR gates 2-1-24 and 2-1-25.

The advanced-phase clock signal $\psi 1$ is supplied to the clock input terminals of flip-flops 2-1-21, 2-1-26, and 2-1-27. The middle-phase clock signal $\psi 2$ is supplied to the clock input, terminal of flip-flop 2-1-22, and is output as the recovered clock signal CLOCK1. The delayed-phase clock signal $\psi 3$ is supplied to the clock input terminal of flip-flop 2-1-23. The received data signal RD1 is supplied to the data input terminals of flip-flops 2-1-21, 2-1-22, and 2-1-23.

The non-inverted output of flip-flop 2-1-22, representing the received data sampled at the timing of the middle-phase clock signal $\psi 2$, is output as the recovered data signal DATA1.

Exclusive-OR gate 2-1-24 receives the non-inverted outputs of flip-flops 2-1-21 and 2-1-22. The output terminal of exclusive-OR gate 2-1-24 is coupled to the data input flip-flop 2-1-26, the non-inverted output of which is the delay signal supplied to the controller 2-1-3. The delay signal accordingly indicates disagreement between the received data as sampled at the timing of the middle-phase clock $\psi 2$, and the received data as sampled at the timing of the advanced-phase clock $\psi 1$.

Exclusive-OR gate 2-1-25 receives the non-inverted outputs of flip-flops 2-1-22 and 2-1-23. The output terminal of exclusive-OR gate 2-1-25 is coupled to the data input flip-flop 2-1-27, the non-inverted output of which is the advance signal supplied to the controller 2-1-3. The advance signal accordingly indicates disagreement between the received data as sampled at the timing of the middle-phase clock $\psi 2$, and the received data as sampled at the timing of the delayed-phase clock $\psi 3$.

When the sampling timing determined by the middle-phase clock signal $\psi 2$ is not near any transition in the received data signal, the samples taken by flip-flops 2-1-21 and 2-1-23 at timings determined by the advanced-phase clock $\psi 1$ and delayed-phase clock $\psi 3$ will have the same value as the sample taken by flip-flop 2-1-22 at the timing determined by the middle phase $\psi 2$, so there will be no disagreement, and the delay and advance signals will both be low.

If the data transitions approach the sampling timings determined by the middle-phase clock signal $\psi 2$, however, then a data transition may occur between this sampling timing and the sampling timing determined by the advanced-phase clock signal $\psi 1$ or the delayed-phase clock signal $\psi 3$. If a data transition occurs between the sampling timings determined by $\psi 1$ and $\psi 2$, then the samples taken by flip-flops 2-1-21 and 2-1-22 will disagree, exclusive-OR gate 2-1-24 will detect the disagreement, and a high delay signal will be output. If a data transition occurs between the sampling timings determined by $\psi 2$ and $\psi 3$, then the samples taken by flip-flops 2-1-22 and 2-1-23 will disagree, exclusive-OR gate 2-1-25 will detect the disagreement, and a high advance signal will be output.

Referring again to FIG. 1, the controller 2-1-3 receives the input clock signal $\phi$ from the PLL 10, as well as the delay and advance signals from the data phase monitor 2-1-2. The controller 2-1-3 inverts clock signal $\phi$, operates in synchronization with the inverted clock signal, and modifies the continents of the five-bit, phase selection signal according to the delay and advance signals.

Normally, only one bit of the five-bit phase selection signal is high at a time. If bit x is currently high (where x is a bit number from one to five), then upon receiving a high delay signal, the controller 2-1-3 sets bit x −1 to the high level. One $\phi$ clock cycle later, the controller 2-1-3 resets bit x to the low level. The high states of bits x and x −1 thus overlap for one clock cycle, after which bit x −1 remains high and bit x remains low.

Similarly, if an advance signal is received when bit x is high, the controller 2-1-3 sets bit x +1 to the high level, then resets bit, x to the low level one cycle later, switching from bit x to bit x +1 with a one-cycle overlap. Bits one to five are input to AND gates 2-1-121, 2-1-122, 2-1-123, 2-1-124, and 2-1-125, respectively, in the voltage-controlled delay line 2-1-1.

These bit operations wrap around from one to five. That is, if bit x is bit one, then bit x −1 is bit five, and if bit x is bit five, then bit x +1 is bit one.

The changes in bit levels of the phase selection signal are made when the clock signal $\phi$ goes low. The one-cycle overlap ensures that the resulting changes in the three-phase clock signal will be free of glitches.

After recognizing an advance signal or delay signal from the data phase monitor 2-1-2, the controller 2-1-3 ignores further delay and advance signals for a certain protection interval Tp, to allow time for the phase selection signal to be changed, and for the effect of the change to propagate through the voltage-controlled delay line 2-1-1 and data phase monitor 2-1-2. After the protection interval Tp has elapsed, the controller 2-1-3 again accepts input of the delay or advance signal.

The controller 2-1-3 is a logic circuit that can be readily synthesized on the basis of the description given above. A drawing of the internal structure of the controller 2-1-3 will be omitted.

Next, the operation of the first embodiment will be described.

To receive data, the PLL 10 is supplied with a reference clock having a frequency equal to 1/N the bit rate of the data. The PLL 10 multiplies this frequency by N to generate the clock signal $\phi$, which is supplied to the (lock/data recovery circuits 2-1 to 2-i. The clock/data recovery circuits 2-1 to 2-i also receive the control voltage V applied to the VCO 104 that produces the clock signal $\phi$.

The clock/data recovery circuits all operate alike, so only the operation of clock/data recovery circuit 2-1 will be described.

As explained above, clock/data recovery circuit 2-1 samples the data signal received at data input terminal 3-1 in synchronization with the middle-phase clock signal $\psi 2$, outputs this clock signal ψ2 as the recovered clock signal CLOCK1, and outputs the sampled data as the recovered data DATA1. Clock signal ψ2 has the same frequency as the input clock signal φ, with a phase delay generated by the voltage-controlled delay line 2-1-1 according to the phase selection signal from the controller 2-1-3.

When the phase of the three-phase clock signal needs to be advanced or delayed, the data phase monitor 2-1-2 detects this condition as explained above, and outputs a high advance signal or delay signal. The controller 2-1-3 responds by modifying the bit levels in the phase selection signal, thereby changing the amount by which the clock signal φ is delayed to produce the three-phase clock signal.

Figure 5:
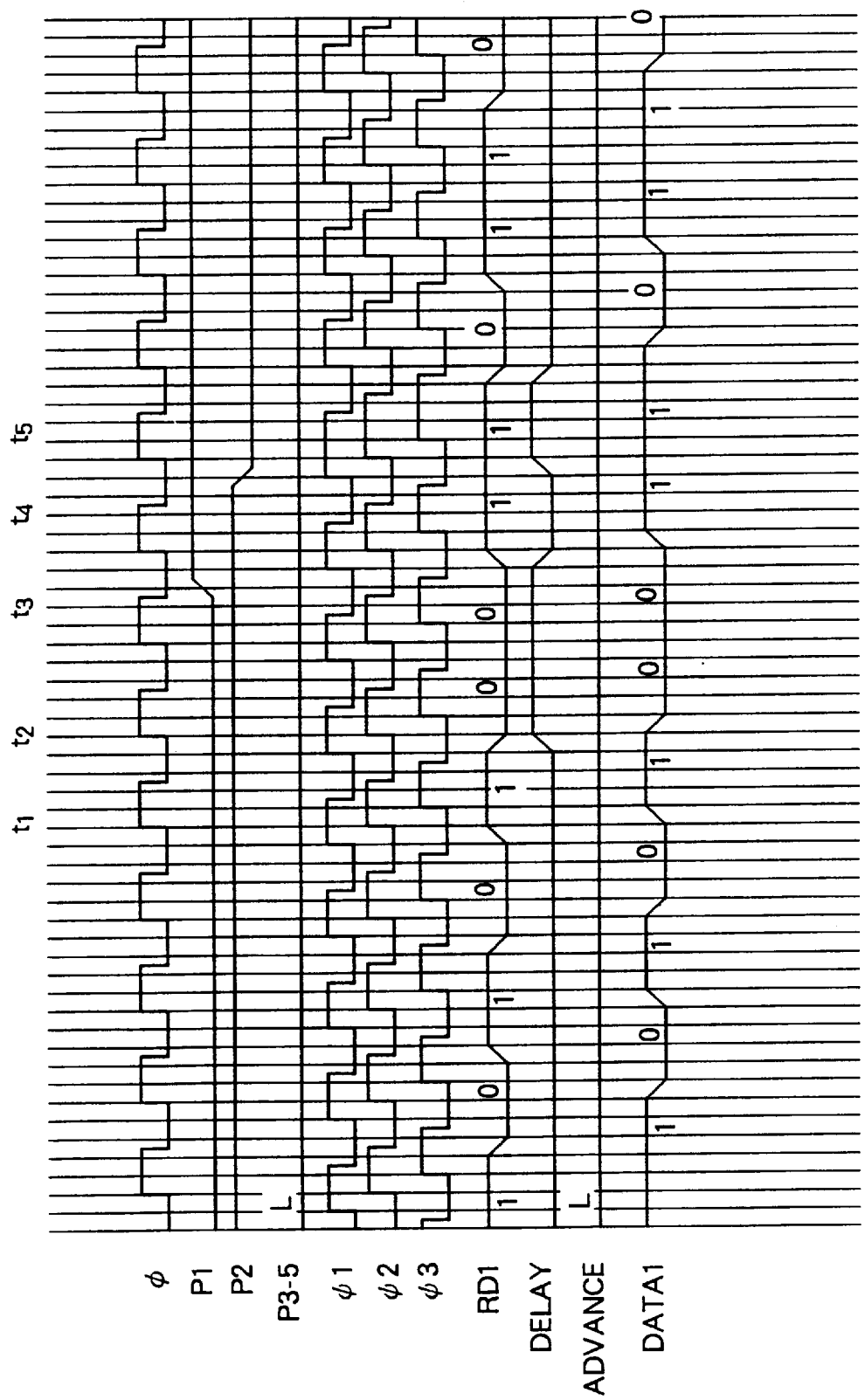
FIG. 5 is a timing diagram illustrating the operation of the first embodiment.

FIG. 5 shows all example in which bit two (P2) of the phase selection signal is initially high, while the other bits (P1, P3, P4, and P5) are low. The letter L on the waveform of bits P3 to P5 (P3–5) indicates the Low level. In this state the input clock signal φ passes through the second AND gate 2-1-122 and is delayed by ten NOR gates 2-1-113 to 2-1-1112 in the voltage-controlled delay line 2-1-1, before being output as the middle-phase clock signal ψ2. The middle-phase clock signal ψ2 accordingly has the same phase as the input clock signal φ.

The received data signal RD1 is sampled on the low-to-high transitions of clock signals ψ1, ψ2, and ψ3; that is, the RD1 value is latched in flip-flops 2-1-21, 2-1-22, and 2-1-23 at these timings. Around time $t_1$, the RD1 value sampled by ψ1 differs from the RDJ value sampled by ψ2 and ψ3. The same is true around time $t_2$. Propagating through the flip-flops and exclusive-OR gates in the data phase monitor 2-1-2, these disagreeing values cause the delay signal to go high for two ψ1 cycles, from about time $t_2$ to about time $t_3$.

At the high-tlo-low transition the input clock φ at time $t_3$, the controller 2-1-3 sets the first bit (P1) of the phase selection signal to the high level. One cycle later, at time $t_4$, the controller 2-1-3 resets the second bit (P2) to the low level. The input clock signal φ now enters the NOR-gate cascade in the voltage-controlled delay line 2-1-1 through the first AND gate 2-1-121, and is delayed by two additional NOR gates 2-1-111 and 2-1-112, shifting the phase of clock signals ψ1, ψ2, and ψ3 back by substantially one-fifth of a cycle. The new phase has to propagate through the NOR-gate cascade, so the change becomes apparent about one cycle later, around time $t_5$, The one-cycle overlap of the high states or the first and second bits (P1 and P2) of the phase selection signal ensures a clean phase transition, without glitches.

Around time $t_5$, the data phase monitor 2-1-2 generates another high delay signal, but this signal is ignored because it occurs during the protection interval. The advance signal remains low throughout the operation in FIG. 5, because the data sampled by clock phases ψ2 and ψ3 always agree.

The phase adjustment at time $t_5$ shifts the sampling timings back so that the sampling timing determined by the middle-phase clock signal ψ2 is closer to the middle of the bit cells in the received data signal RD1. After time $t_5$, for the duration shown in the drawing, there are no further disagreements among the data sampled by clock phases ψ1, ψ2, and ψ3. All of the data in FIG. 5 are recovered correctly, as shown by the DATA1 waveform.

If the sampling timing determined by clock signal ψ2 later drifts too far back, in relation to the received data signal, then a received data transition may occur between the sampling timings determined by clock signals ψ2 and ψ3, causing the data phase monitor 2-1-2 to output a high advance signal. The controller 2-1-3 will then switch back to the state in which the second bit of the phase selection signal is high, shifting the sampling timing forward by one-fifth of a cycle.

Since the voltage-controlled NOR gates in the voltage-controlled delay line 2-1-1 receive the same control voltage V as the voltage-controlled NOR gates in the VCO 104, changes in the phase selection signal alter the phase of the three-phase clock in substantially uniform steps equal to one-fifth of one cycle of the input clock signal φ, and the spacing between the three phases ψ1, ψ2, and ψ3 is also substantially equal to one-fifth of one cycle. This uniformity has the desirable effect of producing the same phase shift of one-fifth of one cycle when the high bit in the phase selection signal wraps around from bit one to bit Five, or from bit five to bit one, as in other transitions, and the further desirable effect of making the operation of the clock/data recovery circuit more predictable, thus making timing margins easier to calculate.

Like conventional clock/data recovery apparatus employing a multiple-phase clock signal, the first embodiment can maintain correct, sampling timings even during extended intervals of identical data values, because during these intervals, the middle-phase clock signal ψ2 remains locked in a fixed phase relationship to the input clock signal φ, which is locked to a stable reference clock.

Unlike conventional apparatus, the first embodiment requires the distribution of only one clock signal φ and one control voltage signal V to the clock/data recovery circuits 2-1 to 2-i. Much less interconnection wiring is required than in a comparable conventional system distributing five clock phases to each clock/data recovery circuit. The first embodiment can accordingly accommodate more data channels than can conventional apparatus.

By generating multiple clock phases locally, in the voltage-controlled delay line in each clock/data recovery circuit, the first embodiment eliminates problems of clock skew. Input of the control voltage V to the voltage-controlled delay line enables a substantially uniform set of clock delays to be produced, producing the same effect as if a multiple-phase clock had been accurately distributed from the PLL, 10.

Since only one clock signal φ is distributed, opportunity for the clock signal to be disrupted by noise is reduced. Disruptions that might occur in shifting from one locally-generated phase to another are avoided by holding both the new and old bits of the phase selection signal high for one cycle.

Second Embodiment

Figure 6:
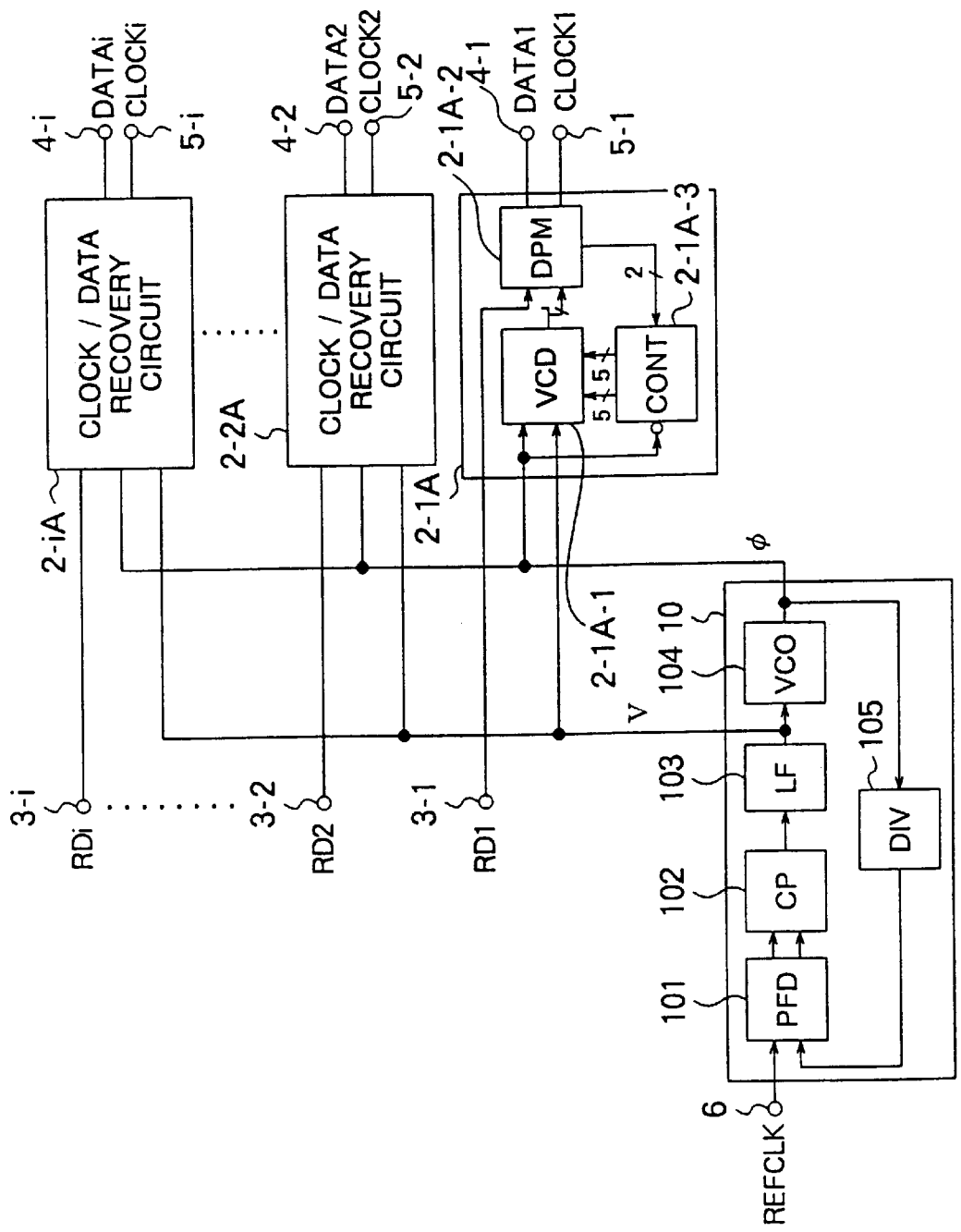
FIG. 6 is a block diagram or a clock/data recovery apparatus according to a second embodiment of the invention.

FIG. 6 shows the general configuration of the second embodiment, using the same reference numerals as in FIG. 1 for identical elements. The general configuration is the same as in FIG. 1, but the internal structure of the clock/data recovery circuits 2-1A to 2-iA differs. One difference, as shown in clock/data recovery circuit 2-1A, is that the controller 2-1A-3 supplies the voltage-controlled delay line 2-1A-1 with two five-bit signals, these being the phase selection signal of the first embodiment, and a delay switching signal. The internal configurations of the voltage-controlled delay line 2-1A-1 and controller 2-1A-3 accordingly differ from the first embodiment.

Figure 7:
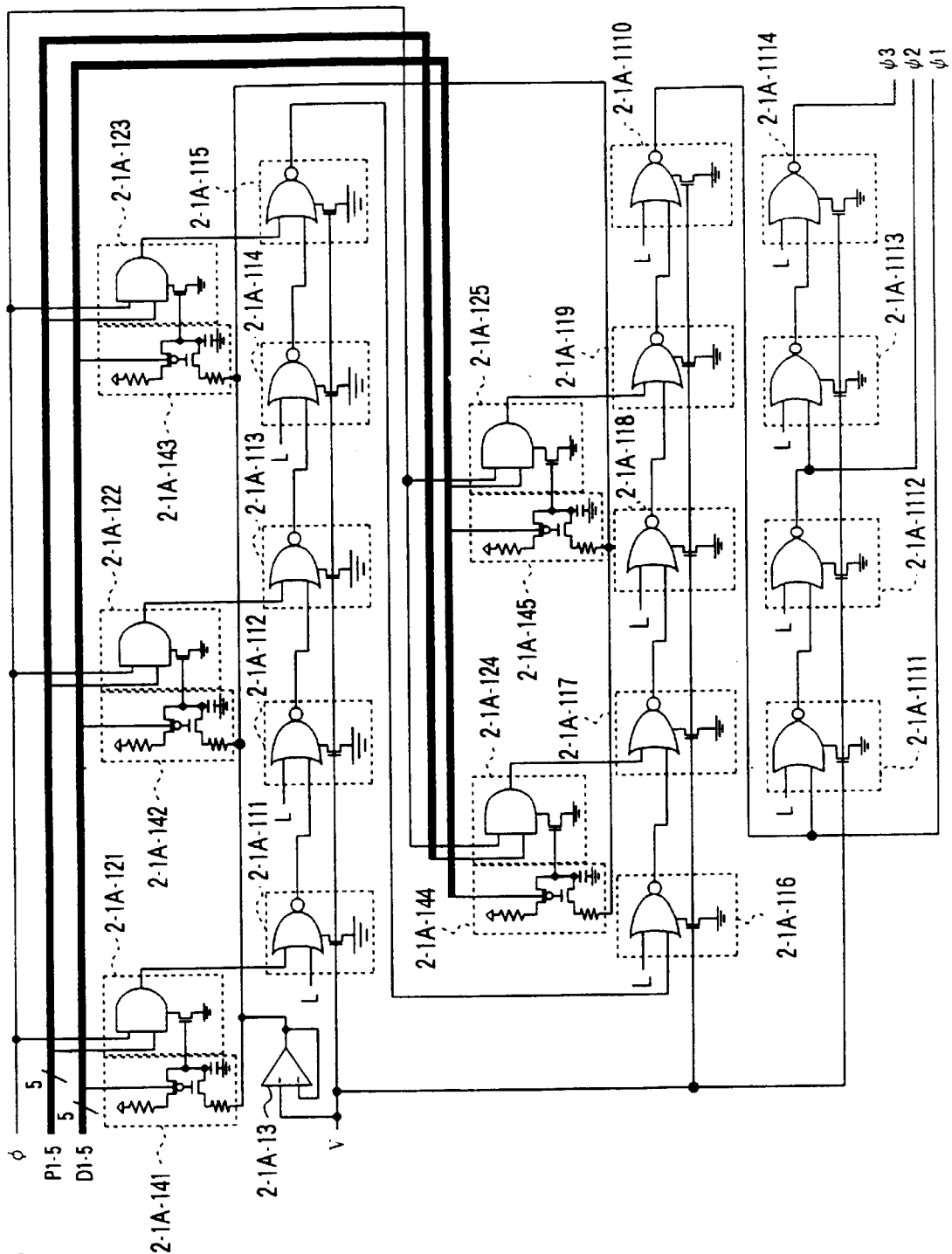
FIG. 7 is a more detailed block diagram of a voltage-controlled delay line used in the second embodiment.

FIG. 7 shows the internal structure of the voltage-controlled delay line 2-1A-1, using the same reference numerals as in FAG. .3 (with the addition of the letter A) for the voltage-controlled NOR gates 2-1A-111 to 2-1A-1114 and AND gates 2-1A-121 to 2-1A-125. The voltage-controlled NOR gates are the same as in the first embodiment, and are connected in the same way.

In the second embodiment, the AND gates 2-1A-121 to 2-1A-125 are also voltage-controlled, each having a field-effect transistor inserted in series between the AND logic circuit and ground, for control of the propagation delay. The voltage-controlled AND gates 2-IA-121 to 2-IA-125 are designed to have twice the propagation delay of the voltage-controlled NOR gates 2-1A-111 to 2-1A-1114, when the same voltage is applied to the delay control transistors in both.

The control voltage V is amplified by a buffer amplifier 2-1A-13 having substantially unity gain. The purpose of the buffer amplifier 2-1A-13 is to supply the control voltage V to the voltage-controlled AND gates 2-1A-121 to 2-1A-125 without affecting the voltage supplied to the voltage-controlled NOR gates 2-1A-111 to 2-1A-1114. The voltage output, by the buffer amplifier 2-1A-13 is supplied to the voltage-controlled AND gates 2-1A-121 to 2-1A-125 through corresponding delay switching circuits 2-1A-141 to 2-1A-145.

Each of the delay switching circuits 2-1A-141 to 2-1A-145 receives one bit of the five-bit. delay switching signal (D1–5) output by the controller 2-1A-3. The delay switching signal bit is applied to the gate electrodes of a pair of switching field-effect transistors (FETs) of opposite channel types. The source electrode of the p-channel switching FET is coupled through a resistor to a power-supply terminal. The source electrode of the n-channel switching FET is coupled through another resistor to the output terminal of the buffer amplifier 2-1A-13. The drain electrodes of both switching FETs are coupled in common to one terminal of a capacitor, which charges or discharges through the resistor connected to the switching FET that is switched on. The other terminal of the capacitor is coupled to ground. The drains of the switching FETs are also coupled to the gate electrode of the delay control field-effect transistor in the corresponding voltage-controlled AND gate.

When a bit of the delay switching signal changes from the low level to the high level, or from the high level to the low level, as t he capacitor in the delay switching circuit charges or discharges, the voltage output by the delay switching circuit changes gradually over an interval constituting the transient response interval of the delay switching circuit. In the following description, the length of the transient response interval will be considered to be five times the resistor-capacitor time constant $\tau_{RC}$ in the delay switching circuit. The time constant $\tau_{RC}$ should have a value that makes the length of the transient response interval equal to five to ten times the length of one cycle of the input clock φ.

When a bit of the delay switching signal is high, the corresponding delay switching circuit outputs the voltage provided by the buffer amplifier 2-1A-13, which is substantially equal to the control voltage V, and the corresponding voltage-controlled AND gate operates with substantially the combined propagation delay of two of the voltage-controlled NOR gates 2-1A-111 to 2-1A-1114. When the delay switching signal bit is low, the delay switching circuit outputs the power-supply voltage, reducing the propagation delay of the voltage-controlled AND gate to a minimum value, which is negligible in comparison to the propagation delays of the voltage-controlled NOR gates 2-1A-111 to 2-1A-1114.

The controller 2-1A-3 normally sets just one bit of the phase selection signal and one bit of the delay switching signal to the high level. If bit y of the phase selection signal is high, then bit y+1 of the delay switching signal is high.

When the data phase monitor 2-1A-2 outputs a high delay signal, if bit y+1 of the delay switching signal is currently high, the controller 2-1A-3 resets bit y+1 to the low level, and simultaneously sets bit y to the high level. When the data phase monitor 2-1A-2 outputs a high advance signal, if bit y+1 of the delay switching signal is currently high, the controller 2-1A-3 waits for one clock cycle, then resets bit y+1 to the low level, and simultaneously sets bit y+2 to the high level. There is no overlap of the high levels of the new and old bits.

Changes in the levels of the delay switching signal bits are made in synchronization with high-to-low transitions of the clock signal φ. The above bit operations wrap around from bit five to bit one.

The controller 2-1A-3 controls the phase selection signal as in the first, embodiment, changing from one bit to another with a one-cycle overlap. When the change is made in response to a delay control signal, the controller 2-1A-3 waits for the above-mentioned transient response time $(5 \times \tau_{RC})$ before modifying the clock phase selection bits.

After recognizing a delay signal or advance signal from the data phase monitor 2-1A-2, the controller 2-1A-3 ignores further delay and advance signals from the data phase monitor 2-1A-2 for a certain protection interval Tp. The protection interval Tp is longer than the transient. response time $(5 \times \tau_{RC})$ of the control signals supplied to the voltage-controlled AND gates 2-1A-121 to 2-1A-125.

Drawings of the internal structure of the data phase monitor 2-1A-2 and controller 2-1A-3 will be omitted. The data phase monitor 2-1A-2 has the same internal structure as in the first embodiment.

Next, the operation of the second embodiment will be described, focusing on the operation of clock/data recovery circuit 2-1A. The other clock/data recovery circuits 2-2A to 2-IA have the same structure and operate in the same way.

Normally, clock/data recovery circuit 2-1A operates in substantially the same way as the clock/data recovery circuit 2-1 in the first embodiment. If bit y of the phase selection signal and bit y+1 of the delay switching signal are high, the voltage-controlled AND gate 2-1A-12y through which the input clock signal φ passes has a small propagation delay, Comparable to the delay in the first embodiment, because the corresponding bit y of the delay switching signal is low.

Figure 8:
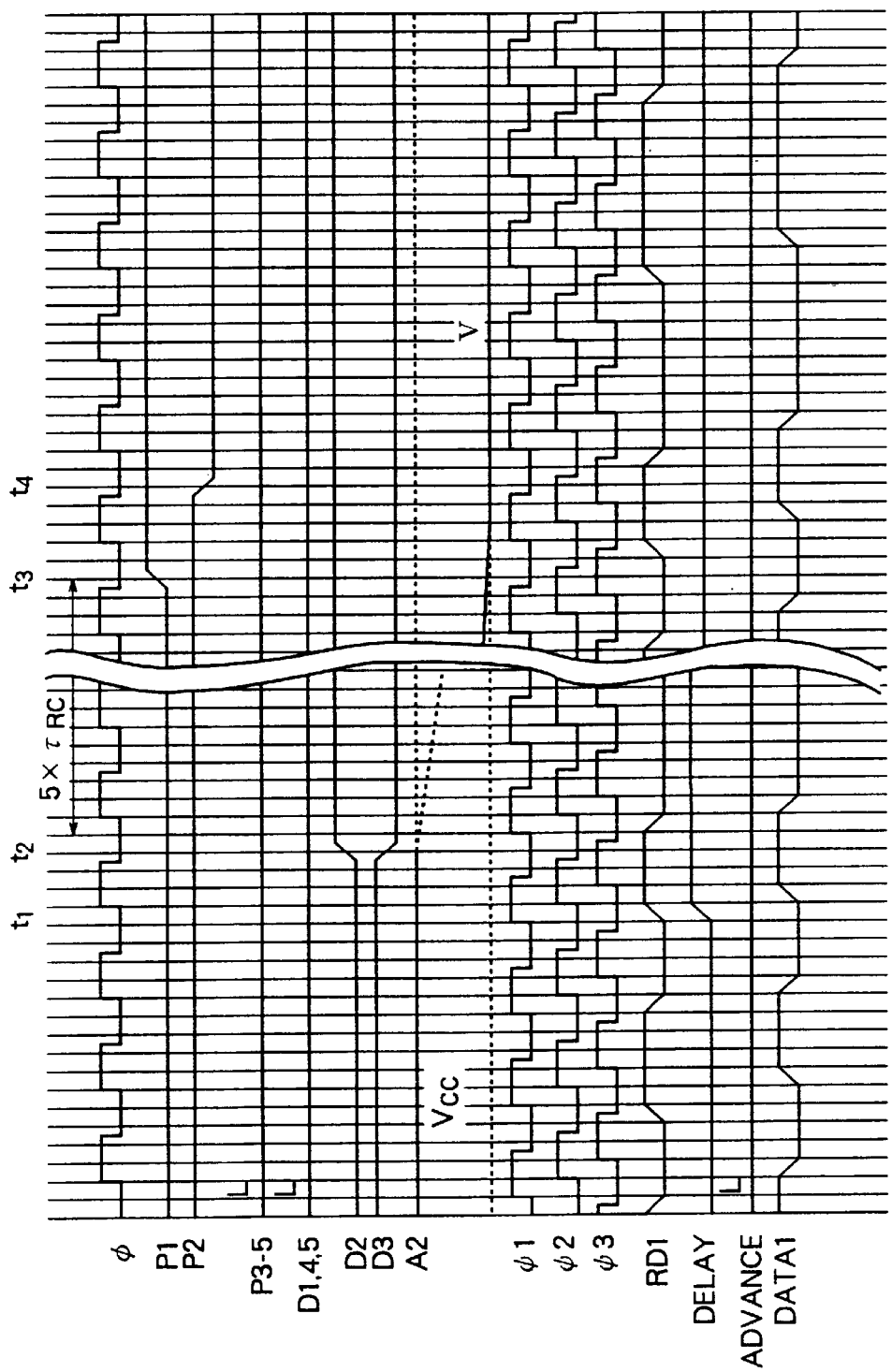
FIGS. 8 and 9 are timing diagrams illustrating the operation of the second embodiment.

This state in illustrated as the initial state in FIG. 8, for the case in which y is equal to two. Waveform A2 indicates the control voltage supplied by the second delay switching circuit 2-1A-142 to the second voltage-controlled AND gate 2-1A-122. Initially this voltage is equal to the power-supply voltage ($V_{CC}$). in the delay switching signal, bit three (D3) is high, and the other bits are low.

At time $t_1$ in FIG. 8, the data phase monitor 2-1A-2 outputs a high delay signal. The controller 2-1A-3 responds at the next high-to-low transition of the input clock signal φ (time $t_2$) by resetting bit three (D3) of the delay switching signal to the low level, and setting bit two (D2) to the high level. The voltage output by delay switching circuit 2-1A-142 begins a gradual drop, and the propagation delay of the second voltage-controlled AND gate 2-1A-122 gradually increases. The three-phase clock signals ψ1, ψ2, and ψ3 are gradually delayed in phase by corresponding amounts.

At time $t_3$, after the transient response interval $(5 \times \tau_{RC}$ measured from time $t_2$), the voltage output by delay switching circuit 2-1A-122 has settled to the level of the control voltage V, and the propagation delay of the second voltage-controlled AND gate 2-1A-122 has reached a value substantially equal to the combined propagation delay of two of the voltage-controlled NOR gates. Over the interval from $t_2$ to $t_3$, the phase of the three-phase clock signal is gradually shifted back by an amount substantially equal to one-fifth of one clock cycle.

At time $t_3$, the controller 2-1A-3 sets the first bit P1 of the phase selection signal to the high level, so that the input clock signal φ also passes through the first voltage-controlled AND gate 2-1A-121. Since the first bit D1 of the delay switching signal is low, this voltage-controlled AND gate 2-1A-121 has a negligible propagation delay. The combined propagation delay of the first voltage-controlled AND gate 2-1A-121 and the first two voltage-conltrolled NOR gates 2-1A-111 and 2-1A-112 is substantially the same as the propagation delay of the second voltage-controlled AND gate 2-1A-122.

From time $t_3$ to $t_4$, the two inputs to voltage-controlled NOR gate 2-1A-113 accordingly go high and low substantially in unison. At time $t_4$, the controller 2-1A-3 resets the second bit P2 of the phase selection signal to the low level, after which the input from the second voltlage-controlled AND gate 2-1A-122 to voltage-controlled NOR gate 2-1A-113 remains low. holding this input low does not alter the output of NOR gate 2-1A-113. The switching of the clock supply from the second voltage-controlled AND gate 2-1A-122 to the first voltage-controlled AND gate 2-1A-121 at times $t_3$ and $t_4$ does not shift the phase of the three-phase clock signal, because the phase shift has already been completed during the interval from time $t_2$ to time $t_3$.

The phase of the three-phase clock signals $\psi 1$, $\psi 2$, and $\psi 3$ is accordingly shifted smoothly and gradually, with no unusually long or short cycles. The phase shift is completed within the protection interval $T_p$, so the controller 2-1A-3 ignores further input of delay and advance signals from the data phase monitor 2-1A-2 while the phase shift is in progress.

Figure 9:
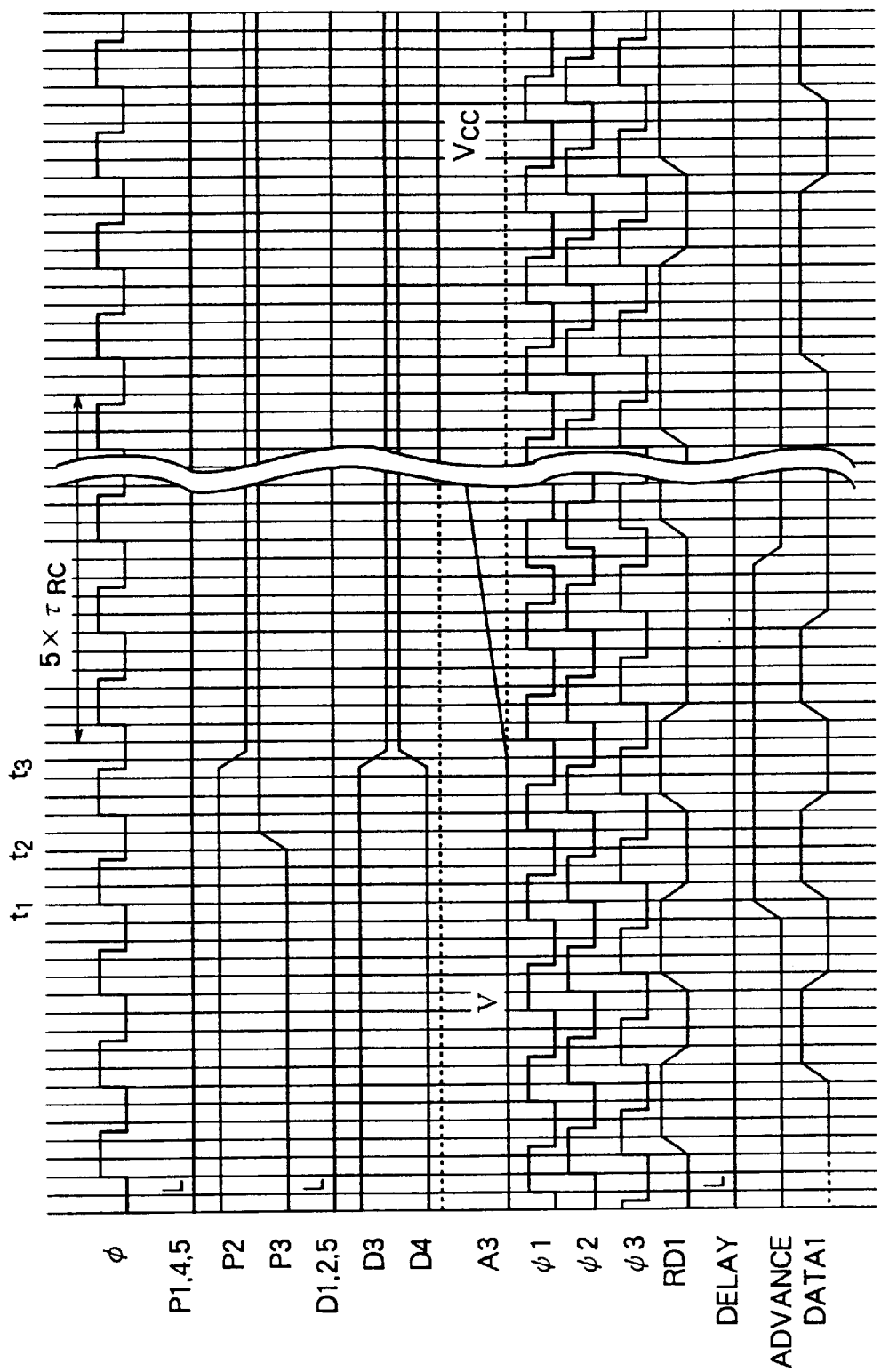

FIG. 9 illustrates the changes made in response to an advance signal from the data phase monitor 2-1A-2. The initial state is the same as in FIG. 8, with bit P2 high in the phase selection signal, and bit D3 high in the delay switching signal.

The advance signal goes high at time $t_1$. At the next high-to-low transition of the input clock signal $\phi$, at time $t_2$, the controller 2-1A-3 sets bit P3 of the phase selection signal to the high level. Clock signal $\phi$ now passes through both the second and third voltage-controlled AND gates 2-1A-122 and 2-1A-123.

Since bit D2 is low and bit D3 is high in the delay switching signal, the second voltage-controlled AND gate has a negligible propagation delay, while the third voltage-controlled AND gate has a propagation delay substantially equal to the propagation delay of two voltage-controlled NOR gates. The clock signal output by the third voltage-controlled AND gate 2-1A-123, and the clock signal output by voltage-controlled NOR gate 2-1A-114, which has passed through voltage-controlled AND gate 2-1A-122 and voltage-controlled NOR gates 2-1A-113 and 2-1A-114, are substantially in phase with each other. It makes substantially no difference whether both of these clock signals are input to voltage-controlled NOR gate 2-1A-115, or only one of them is input. The setting of bit P3 at time $t_2$ therefore has no immediate effect on the three-phase clock signals $\psi 1$, $\psi 2$, and $\psi 3$.

One clock cycle, later, at time $t_3$, the controller 2-1A-3 resets bit P2 in the phase selection signal and bit D3 in the delay switching signal, and sets bit D4. The voltage A3 supplied by the third delay switching circuit 2-1A-143 to the third voltage-controlled AND gate 2-1A-123 now begins a gradual rise, because bit D3 has been set, and the propagation delay of voltage-controlled AND gate 2-1A-123 gradually decreases. The phase of the three-phase clock signals $\psi 1$, $\psi 2$, and $\psi 3$ gradually shifts forward.

The shift is completed during the transient response interval ($5 \times \tau_{RC}$), in which the voltage A3 gradually rises to the level of the power supply, and the propagation delay of voltage-controlled AND gate 2-1A-123 is gradually reduced to the minimum delay. During this interval, the phase of the three-phase clock signal is advanced by substantially one-fifth of a cycle. This interval falls within the protection interval Tp, so the controller 2-1A-3 ignores further signals from the data phase monitor 2-1A-2 while the shift is in progress.

The second embodiment provides the same advantages as the first embodiment in reducing the amount of interconnection wiring between the PLL 10 and the clock/data recovery circuits 2-1A to 2-iA, and eliminating the problem of clock skew.

A further advantage of the second embodiment is that the recovered clock signals CLOCK1 to CLOCKi, which are the middle phases of the three-phase clock signals, are not forced to undergo any sudden phase shifts. All phase shifts take place smoothly and gradually. This is an advantage for the digital circuits that use the recovered clock signals to process the recovered data, because these circuits do not have to cope with any abrupt timing changes. These digital circuits accordingly become easier to design and fabricate, as the switching speeds of their circuit elements do not have to be as fast.

Third Embodiment

Figure 10:
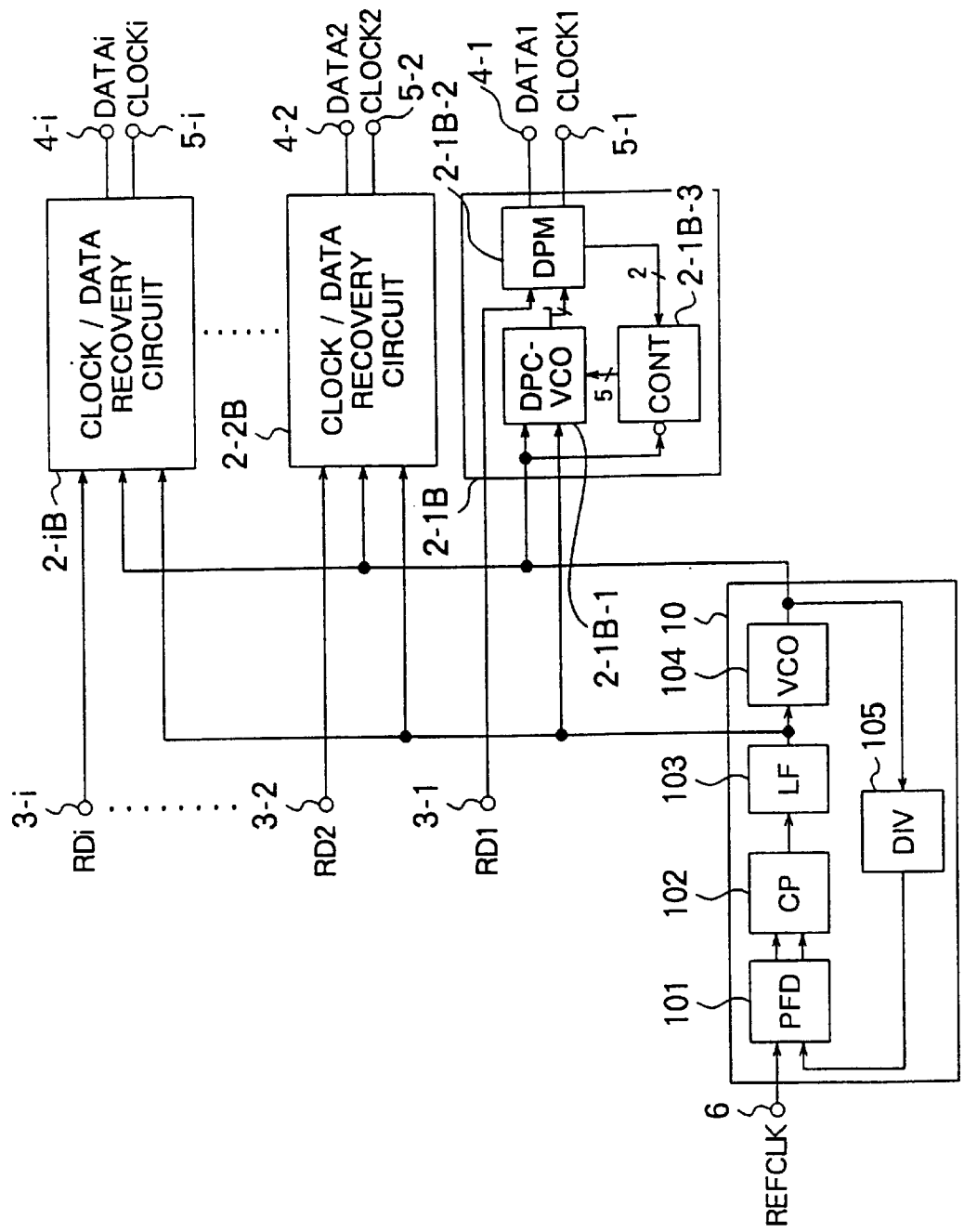
FIG. 10 is a block diagram of a clock/data recovery apparatus according to a third embodiment of the invention.

FIG. 10 shows the general configuration of the third embodiment, using the same reference numerals as in FIG. 1 for identical elements. The general configuration is the same as in FIG. 1, but the internal structure of the clock/data recovery circuits 2-1B to 2-iB differs, as shown in clock/data recovery circuit 2-1B.

Figure 11:
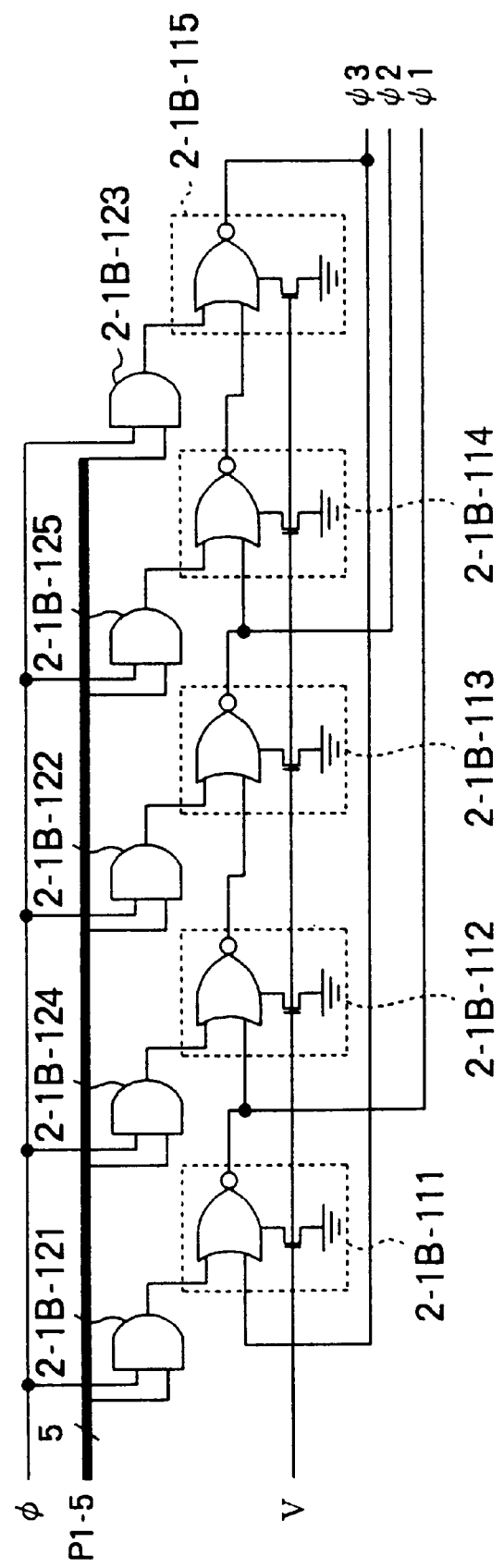
FIG. 11 is a more detailed block diagram of a direct phase control led voltage-controlled oscillator used in the third embodiment.

In place of the voltage-controlled delay line of the first embodiment, clock/data recovery circuit 2-1B has a direct phase controlled voltage-controlled oscillator (DPC-VCO) 2-1B-1. Referring to FIG. 11, the direct phase controlled VCO 2-1B-1 comprises a ring oscillator formed by five voltage-controlled NOR gates 2-1B-111 to 2-1B-115. Coupled to the ring oscillator are five AND gates 2-1B-121 to 2-1B-125. The voltage-controlled NOR gates 2-1B-111 to 2-1B-115 are similar to the voltage-controlled NOR gates used in the VCO 104 in the PLL 10, and are controlled by the same control voltage V. Each voltage-controlled NOR gate receives the output. of the preceding voltlage-controlled NOR gate in the ring, and the output of one AND gate.

The input clock signal $\phi$ is supplied to one input terminal of each of the AND gates 2-1B-121 to 2-1B-125. The other input terminal receives a corresponding bit (one of bits P1 to P5) of the five-bit phase selection signal. The AND gates are coupled to the voltage-controlled NOR gates as follows: the first AND gate 2-1B-121 to the first voltage-controlled NOR gate 2-1B-111; the second AND gate 2-1B-122 to the third voltage-controlled NOR gate 2-1B-113; the third AND gate 2-1B-123 to the fifth voltage-controlled NOR gate 2-1B-115; the fourth AND gate 2-1B-124 to the second voltage-controlled NOR gate 2-1B-112; and the fifth AND gate 2-1B-125 to the fourth voltage-controlled NOR gate 2-1B-124.

The three-phase clock signals $\psi 1$, $\psi 2$, and $\psi 3$ are taken from the output terminals of the first, third, and fifth voltage-controlled NOR gates 2-11B-111, 2-1B-113, and 2-1B-115, respectively.

Clock/data recovery circuits 2-2B to 2-iB have the same internal structure is clock/data recovery circuit 2-1B.

The data phase monitor 2-1B-2 has the same internal structure as the data phase monitor 2-1-2 in the first embodiment. The controller 2-1B-3 differs from the controller 2-1-3 in the first embodiment, only in that, when modifying the values of bits in the phase selection signal, the controller 2-1B-3 does not overlap the high levels of the old and new bits.

Next, the operation of the third embodiment will be described.

At any given time, the input clock signal φ enters the ring oscillator in the direct phase controlled VCO 2-1B-1 through only one AND gate, e.g. AND gate 2-1B-121. Since this ring oscillator is identical in configuration to the ring oscillator in the VCO 104, and is controlled by the same control voltage V, it has substantially the same round-trip propagation time, equal to one half cycle of the clock signal φ. A low-to-high transition of the clock signal φ input to the first voltage-controlled NOR gate 2-1B-111 through AND gate 2-1B-121 will accordingly propagate around the ring and return to NOR gate 2-1B-111 one half cycle later, as a high-to-low transition, just when the clock signal φ input to NOR gate 2-1B-111 from AND gate 2-1B-121 is changing from high to low. Accordingly, both inputs to voltage-(controlled NOR gate 2-1B-111 will change from high to low at substantially the same time.

Low-to-high transitions of the two inputs to voltage-controlled NOR gate 2-1B-111 will also be substantially simultaneous. The ring oscillator formed by voltage-controlled NOR gates 2-1B-111 to 2-1B-115 will therefore oscillate at the same frequency as the frequency of the input clock signal φ, and this frequency will be imparted to the three-phase clock signal. The delay between the three phases ψ1, ψ2, and ψ3 is equal to one-fifth of one cycle, as in the first embodiment.

The ring oscillator formed by voltage-controlled NOR gates 2-1B-111 to 2-1B-115 is forced to oscillate at the frequency of the input clock signal φ even if its round-trip propagation delay is not exactly equal to one half cycle of the input clock signal φ. In this case the duty cycle of the clock signal ψ1 output by the first voltage-controlled NOR gate 2-1B-111 will be slightly less than fifty percent, due to imperfect matching of the input transitions. The duty cycles of clock signals ψ2 and ψ3 will also be slightly less than fifty percent, so the duty cycle of the recovered clock signal CLOCK1 will be less than fifty percent, but, to the deviation from fifty percent will not be large.

Figure 12:
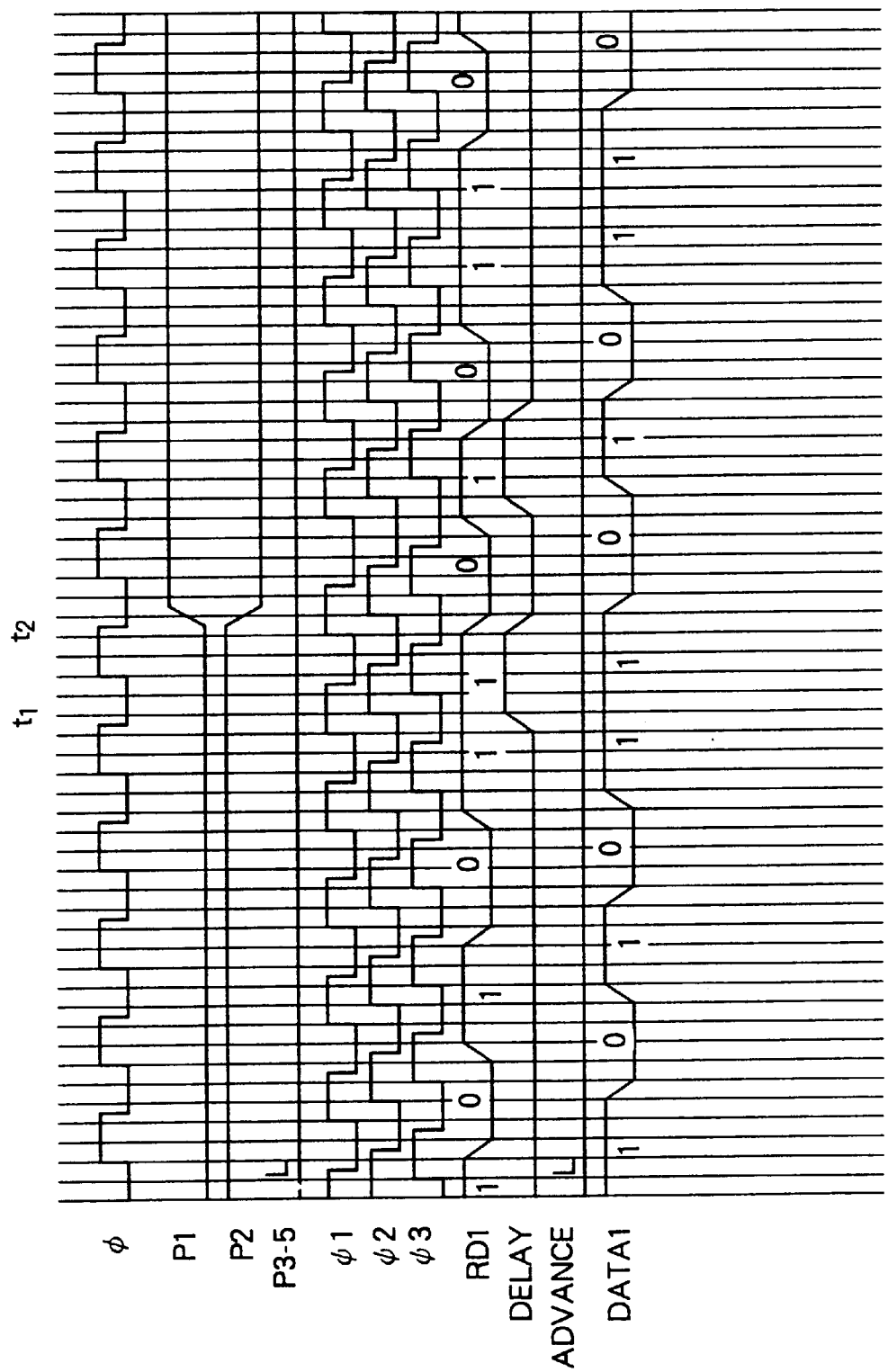
FIG. 12 is a timing diagram illustrating the operation of the third embodiment.

FIG. 12 illustrates the operation of the clock/data recovery circuit 2-1B, starting from a state in which the second bit (P2) of the phase selection signal is high and the other bits are low. In this state the input clock signal φ is input through the second AND gate 2-1B-122 to the third voltage-controlled NOR gate 2-1B-113.

The data phase monitor 2-1B-2 generates a high delay signal at time $t_1$. At the next high-to-low transition oF the input clock signal φ (at time $t_2$), the controller 2-1B-3 sets bit P1 to the high level, and resets bit P2 to the low level. The clock signal φ is now input through the first AND gate 2-1B-121 to the first voltage-controlled NOR gate 2-113-111.

For the next half clock cycle, this change has no effect, because both the first and third voltage-controlled NOR gates 2-1B-111 and 2-1B-113 continue to receive low inputs from AND gates 2-1B-121 and 2-1B-122, as they would have if there had been no change in the following half clock cycle, however, the first voltage-controlled NOR gate 2-1B-111 receives two high inputs that are out or phase by one-fifth cycle, from AND gate 2-1B-121 and voltage-controlled NOR gate 2-1B-115, causing the output, of voltage-controlled NOR gate 111 (ψ1) to remain low for an extra one-fifth cycle.

This lengthened low interval propagates to clock signals ψ2 and ψ3 as shown, after which the three-phase clock is output normally, its phase delayed by one-fifth cycle from the initial state before time $t_2$. The controller 2-1B-3 ignores further input of the delay and advance signals for a protection interval Tp as in the preceding embodiments.

The operation when the data phase monitor 2-1B-2 generates a high advance signal is similar, except that the phase of the three-phase clock signal is advanced.

The third embodiment provides the same advantages as the first embodiment, while using fewer voltage-controlled NOR gates in each clock/data recovery circuit.

A further advantage of the third embodiment is that if the duty cycle of the input clock signal φ is reduced during propagation from the PLL 10 to the clock/data recovery circuits 2-1B to 2-iB, the direct phase controlled VCOs 2-1B-1 to 2-iB-1 will still generate clock signals with a duty cycle of substantially fifty percent, so the recovered clock signals will have duty cycles or substantially fifty percent.

Fourth Embodiment

The fourth embodiment, combines the features of the second and third embodiments.

Figure 13:
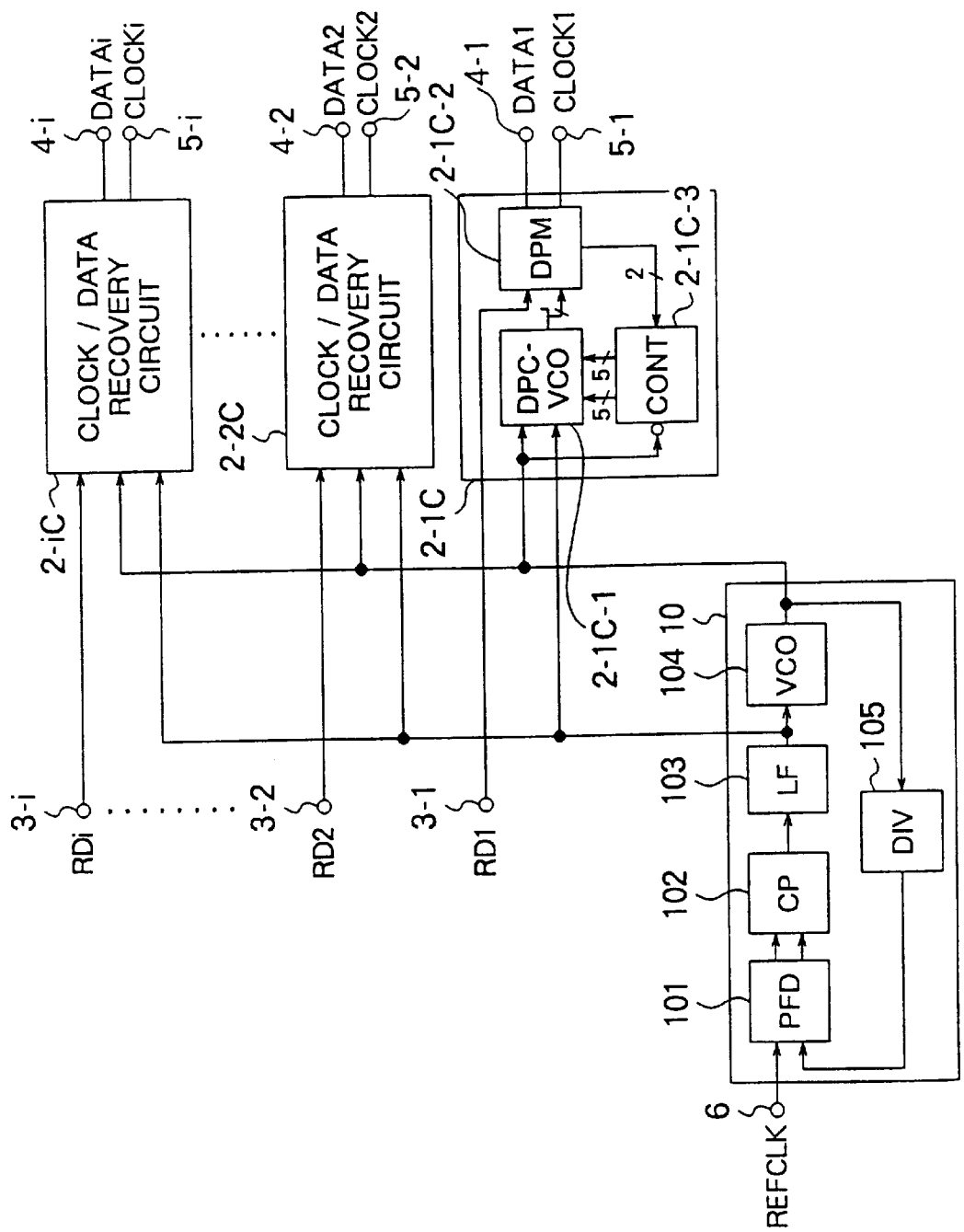
FIG. 13 is a block diagram of a clock/data recovery apparatus according to a fourth embodiment, of the invention.

FIG. 13 shows the general configuration of the fourth embodiment, using the same reference numerals as in FIG. 6 for identical elements. The general configuration is the same as in FIG. 6, but the internal structure of the clock/data recovery circuits 2-1C to 2-iC differs, as shown in clock/data recovery circuit 2-1C.

Figure 14:
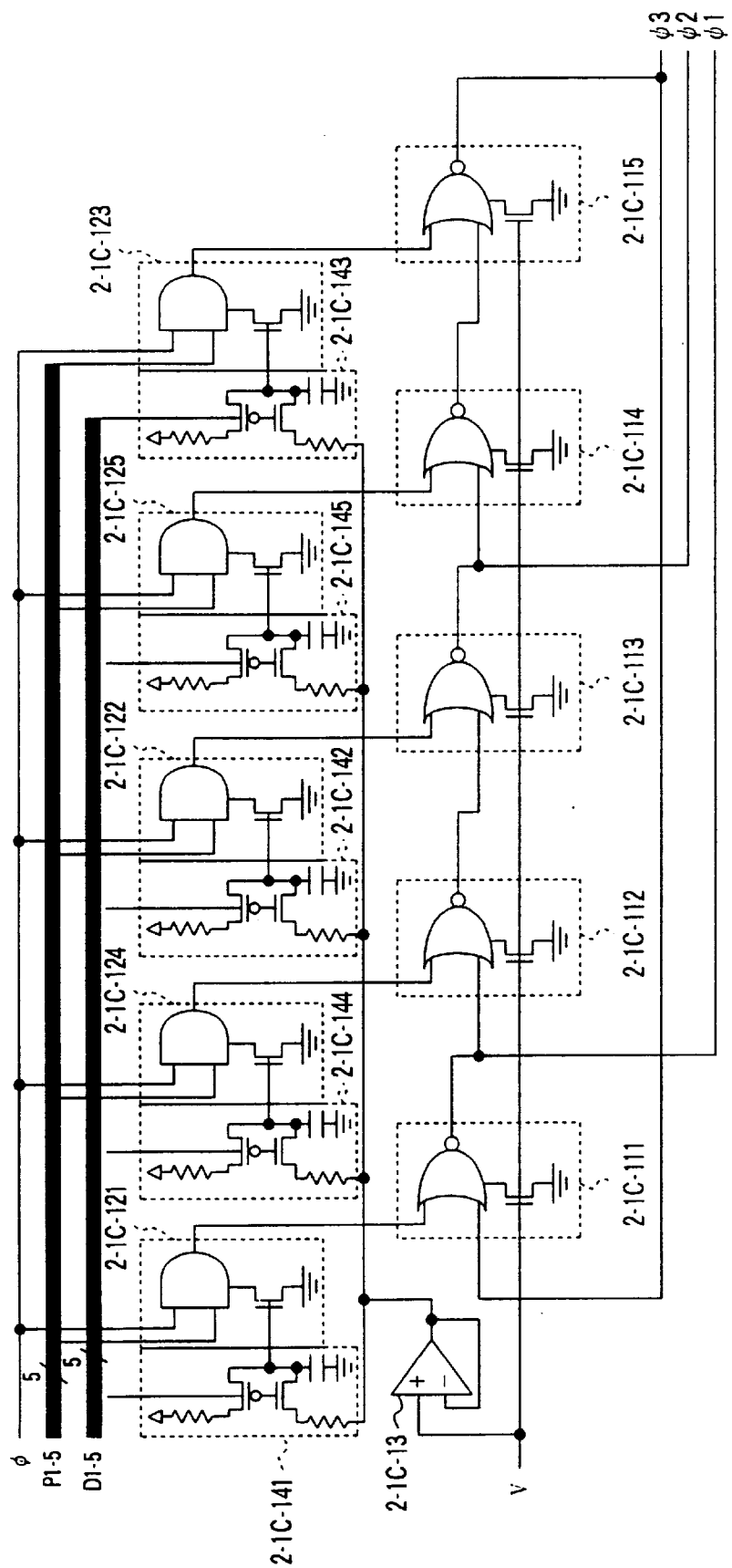
FIG. 14 is a more detailed block diagram of a direct phase controlled voltage-contlrolled oscillator used in the fourth embodiment.

The clock/data recovery circuit 2-1C has a direct phase controlled VCO 2-1C-1 with the structure shown in FIG. 14. The voltage-control led NOR gates 2-1C-111 to 2-1C-115 form a ring oscillator similar to the ring oscillator in the direct phase controlled VCO 2-1B-1 in the third embodiment. The AND gates of the third embodiment, however, are replaced by voltage-controlled AND gates 2-1C-121 to 2-1C-125 and delay switching circuits 2-1C-141 to 2-1C-145 similar to those in the second embodiment. There is also a buffer amplifier 2-1C-13 similar to the buffer amplifier 2-1A-13 in the second embodiment.

As in the second embodiment, when a delay switching circuit supplies the corresponding voltage-controlled AND gate with the voltage output by the buffer amplifier 2-1C-13, which is substantially equal to the control voltage V, the voltage-controlled AND gate has a propagation delay equal to the combined propagation delay of two of the voltage-controlled NOR gates. When the delay switching circuit supplies the power-supply voltage, the voltage-controlled AND gate has a minimum propagation delay, which is negligible in comparison to the propagation delays of the voltage-controlled NOR gates.

The controller 2-1C-3 supplies the direct phase controlled VCO 2-1C-1 with both a phase selection signal (P1–5) and a delay switching signal (D1–5), as in the second embodiment. The timing of these signals differs from the second embodiment in that there is no one-cycle overlap between the high states of old and new bits in the phase selection signal.

The data phase monitor 2-1C-2 has the same structure as in the preceding embodiments.

Clock/data recovery circuits 2-2C to 2-iC have the same internal structure as clock/data recovery circuit 2-1C.

Next, the operation of the fourth embodiment will be described.

Figure 15:
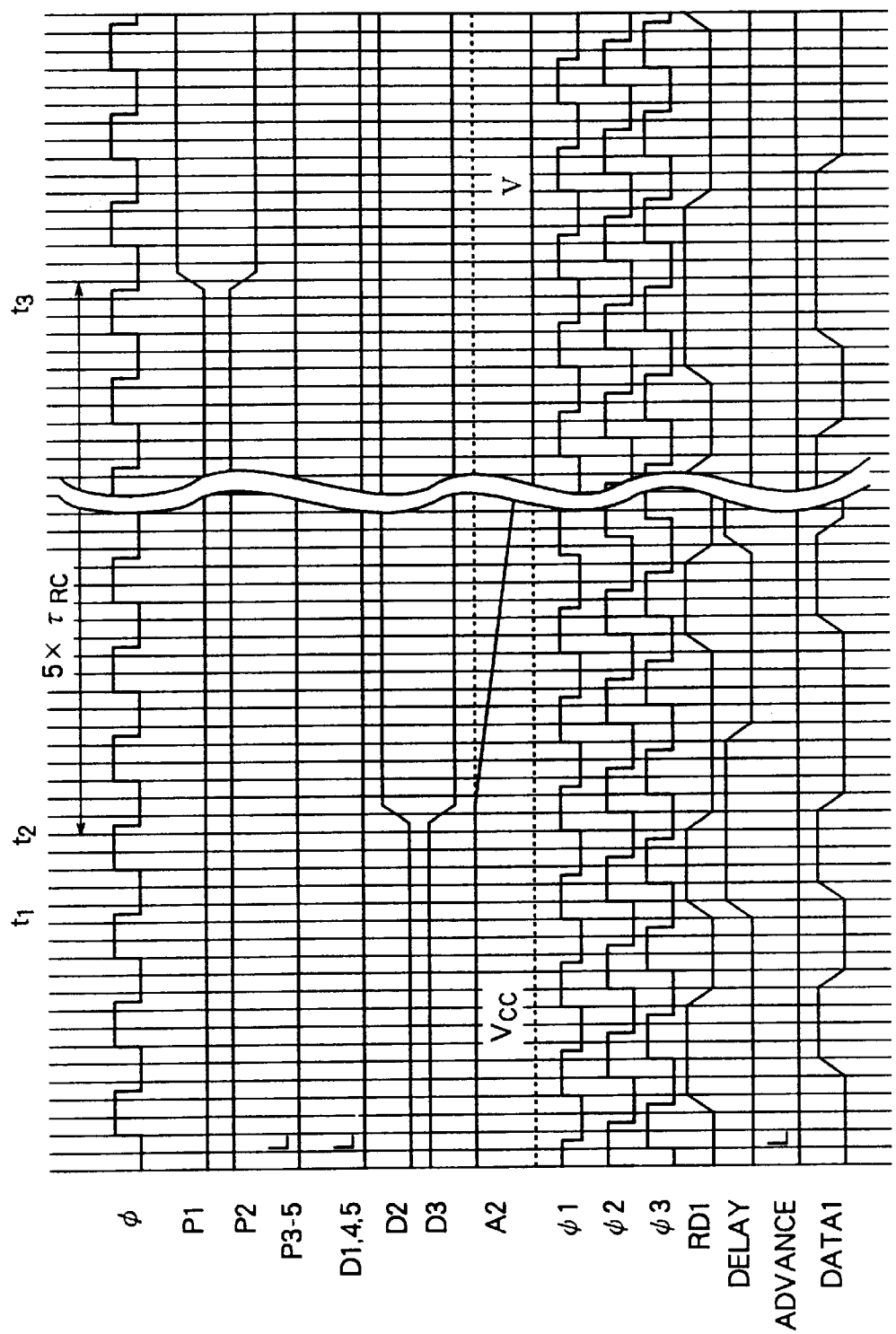
FIGS. 15 and 16 are timing diagrams illustrating the operation of the fourth embodiment.

FIG. 15 illustrates operations starting from a state in which the second bit, (P2) of the phase selection signal and the third bit (D3) of the delay switching signal are high, the other bits of these signals being low. In this state the input clock signal φ is supplied through the second voltage-controlled AND gate 2-1C-122, which has a negligible propagation delay because bit D2 is low, to the third voltage-controlled NOR gate 2-1C-113.

At time $t_1$, the data phase monitor 2-1C-2 outputs a high delay signal. At the next high-to-low transition of clock signal φ, the controller 2-1C-3 resets bit D3 of the delay switching signal, and sets bit D2. The voltage A2 supplied by the second delay switching circuit 2-1C-142 to the second voltage-controlled AND gate 2-1C-122 begins a gradual descent from the power-supply level ($V_{CC}$) to the level of the control voltage V, over the transient response interval ($5 \times \tau_{RC}$) from time $t_2$ to time $t_3$. During this interval, the propagation delay of the second voltage controlled AND gate 2-1C-122 gradually increases from its minimum value to twice the propagation delay of one of the voltage-controlled NOR gates. As the phase of the clock signal supplied from the second voltage-controlled AND gate 2-1C-122 to the third voltage-controlled NOR gate 2-1C-113 is gradually delayed, the phase of the three-phase clock signals ψ1, ψ2, and ψ3 gradually shifts back by one-fifth or a cycle.

During this interval the delay signal goes high again, but this new delay signal is ignored by the controller 2-1C-3, because the new delay signal occurs in the protection interval Tp.

At time $t_3$, the controller 2-1C-3 resets bit P2 in the phase selection signal and sets bit P1. Instead of being supplied through the second voltage-controlled AND gate 2-1C-122, with a propagation delay equivalent to two voltage-controlled NOR gates, to the third voltage-controlled NOR gate 2-1C-113, the clock signal φ is now supplied through the first voltage-controlled AND gate 2-1C-121, with only a short propagation delay, to the first voltage-controlled NOR gate 2-1C-111.

Since the clock signal must now propagate through voltage-controlled NOR gates 2-1C-111 and 2-1C-112 to reach the third voltage-controlled NOR gate 2-1C-113, this abrupt switch causes substantially no change in the phase of the clock reaching the third voltage-controlled NOR gate 113. Accordingly, the ring oscillator in the direct phase controlled VCO 2-1C-1 continues to oscillate in the same phase as just before time $t_3$. The entire operation of altering the phase of clock signals ψ1, ψ2, and ψ3 is accomplished smoothly, with no abrupt changes in the length of the clock cycle.

Figure 16:
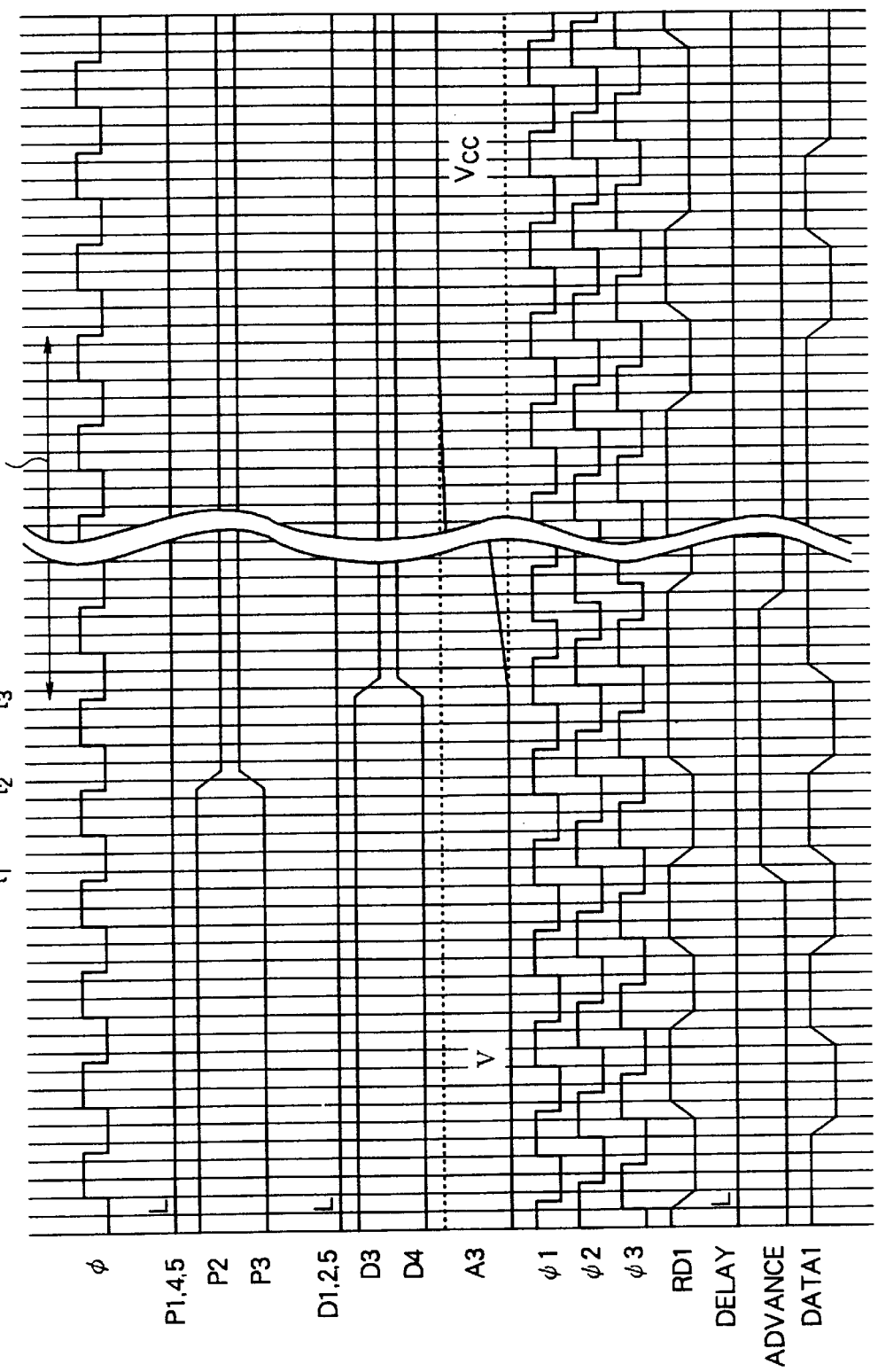

FIG. 16 illustrates another case, starting from the same initial state. At time $t_1$, the data phase monitor 2-1C-2 generates a high advance signal. At the next high-to-low transition of the input clock signal φ, at time $t_2$, the controller 2-1C-3 resets bit P2 of the phase selection signal, and sets bit P3, so that the clock signal φ is supplied to the ring oscillator through the third voltage-controlled AND gate 2-1C-123 instead of the second voltage-controlled AND gate 2-1C-122. Since bit D3 of the delay switching signal is set, the propagation delay of the third voltage-controlled AND gate 2-1C-123 equivalent to two NOR-gate propagation delays compensates for the change, and the ring oscillator continues to oscillate in the same phase.

At the next high-to-low transition of clock signal φ, at time $t_3$, the controller 2-1C-3 resets bit D3 of the delay switching signal, and sets bit D2. The voltage A3 supplied by the third delay switching circuit 2-1C-143 to the third voltage-contirolled AND gate 2-1C-123 gradually increases from the level of the control voltage V to the power-supply level, over the transient response interval ($5 \times \tau_{RC}$) During this interval the propagation delay of the third voltage-controlled AND gate 2-1C-123 gradually decreases, and the phase of the three-phase clock signals ψ1, ψ2, and ψ3 is gradually advanced by one-fifth cycle.

The phase shift takes place during the protection interval Tp, so the controller 2-1C-3 ignores further input of advance and delay signals from the data phase monitor 2-1B-2 until after the phase shift is completed.

The fourth embodiment combines the advantages of all of the preceding embodiments: reduced interconnection wiring, no clock skew, smooth transitions in recovered clock phase, reduced circuit size, and output of recovered clock signals with a duty cycle of substantially fifty percent, even if the duty cycle of the input clock signal φ received by the clock/data recovery circuits 2-1C to 2-iC is less than fifty percent.

Fifth Embodiment

Figure 17:
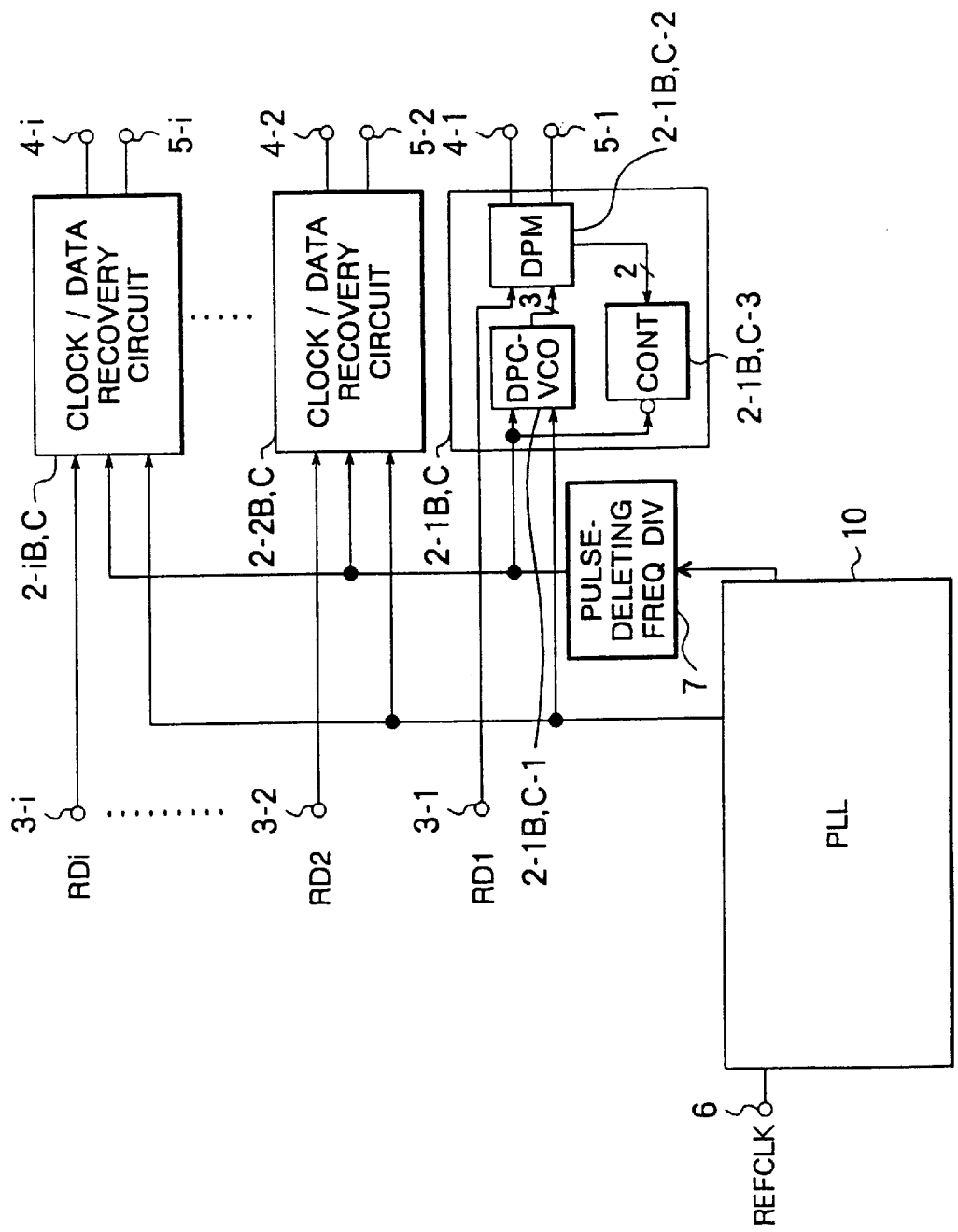
FIG. 17 is a block diagram of a clock/data recovery apparatus according to a fifth embodiment of the invention.

Referring to FIG. 17, the fifth embodiment has the same PLL 10 as in the preceding embodiments, and the same clock/data recovery circuits 2-1B,C to 2-iB,C as in either the third or fourth embodiment, employing a direct phase controlled VCO.

The fifth embodiment also has a pulse-deleting frequency divider (FREQ DIV) 7 that receives the input clock signal φ from the PLL 10, and distributes every P-th high clock pulse to the clock/data recovery circuits 2-1B,C to 2-iB,C, where P is an integer greater than one.

In the clock/data recovery circuit. 2-1B,C, the direct phase controlled VCO 2-1B,C-1 and controller 2-1B,C-3 operate on the divided clock signal output by the pulse-deleting frequency divider 7. The data phase monitor 2-1B,C-2 operates on the three-phase clock signal output by the direct phase controlled VCO 2-1B,C-1 , and does not receive the divided clock signal.

As explained in the third and fourth embodiments, the direct phase controlled VCO 2-1B,C-1 comprises an internal ring oscillator. After receiving a high clock pulse from the pulse-deleting frequency divider 7, the ring oscillator continues to oscillate, generating substantially the same three-phase clock as in the third and forth embodiments, even if the pulse-deleting frequency divider 7 provides no further high clock pulses for some time.

The data phase monitor 2-1B,C-2 has the same internal configuration as in the preceding embodiments. The controller 2-1B,C-3 has the same internal configuration as in the third or forth embodiment, but operates at the reduced frequency of the divided clock signal supplied from the pulse-deleting frequency divider 7.

The other clock/data recovery circuits 2-2B,C to 2-iB,C are similar in structure to clock/data recovery circuit 2-1B,C.

Figure 18:
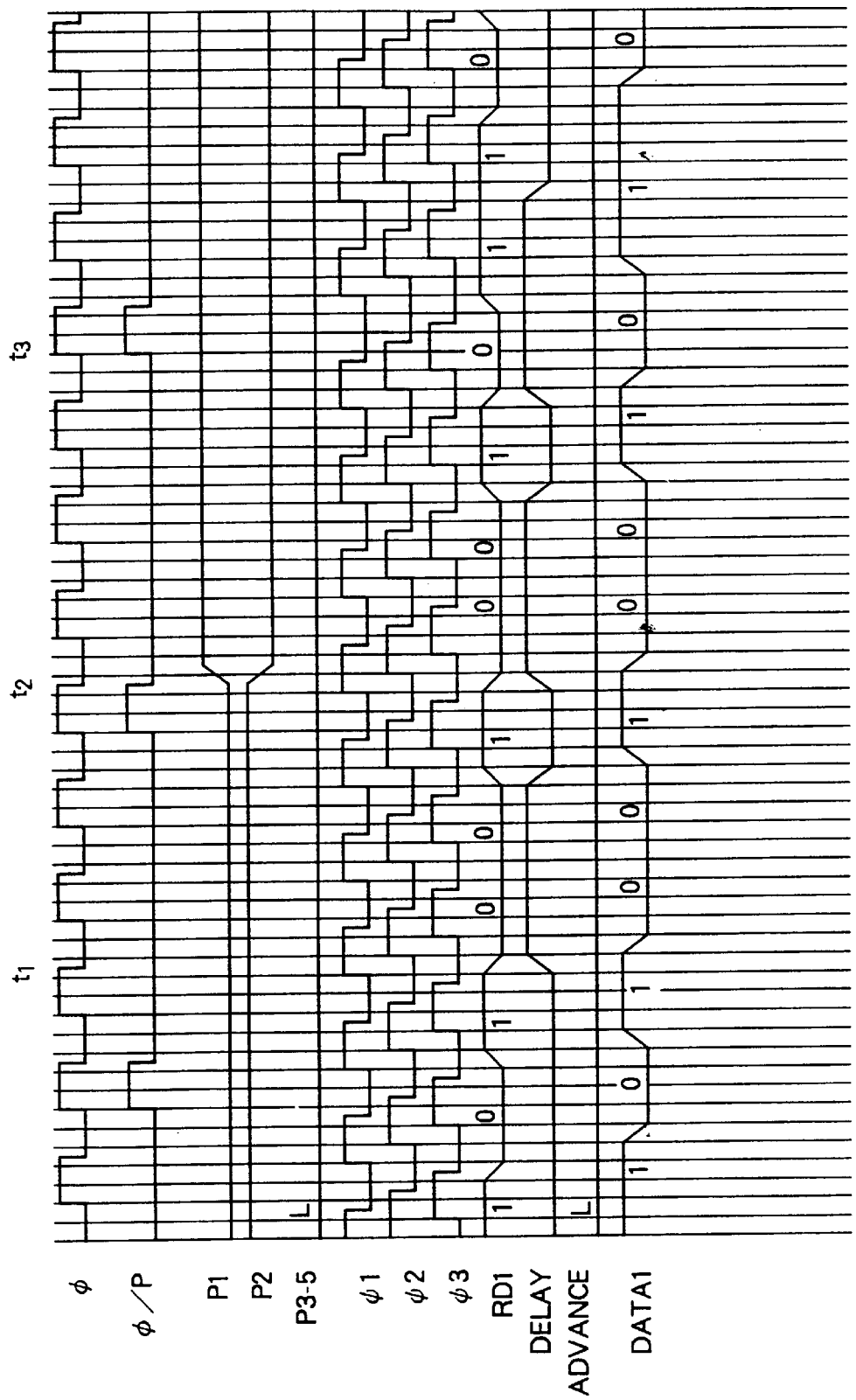
FIG. 18 is a timing diagram illustrating the operation of the fifth embodiment.

The operation of the fifth embodiment will be described with reference to FIG. 18. Waveform φ/P is the waveform of the divided clock signal output by the pulse-deleting frequency divider 7. The value of P is assumed to be equal to four, φ/P thus comprising every fourth high pulse of the input clock signal. The clock/data recovery circuit 2-1B,C is assumed to have the same structure as the clock/data recovery circuit 2-1B in the third embodiment.

In the initial state, bit P2 of the phase selection signal is high, and the other bits are low. At time $t_1$, the data phase monitor 2-1B,C-2 generates a high delay signal. At the next high-to-low transition of the divided clock signal φ/P, at time $t_2$, the controller 2-1B,C-3 resets bit P2 of the phase selection signal, and sets bit P1. This alters the AND gate by which the divided clock signal φ/P is supplied to the ring oscillator, but no high pulse of the divided clock signal φ/P occurs for the next several cycles of the input clock φ, so nothing happens immediately.

At time $t_3$, the divided clock signal φ/P goes high again, producing one lengthened cycle in the three-phase clock signals ψ1, ψ2, and ψ3, thus shifting the three-phase clock back in phase by one-fifth of a cycle. Thereafter, the three-phase clock continues to be output at the new phase.

Despite the slower response of the controller 2-1B,C-3, all of the recovered data still have the correct values, as shown by the DATA1 waveform.

If the direct phase controlled VCO 2-1B,C-1 and controller 2-1B,C-3 have the configuration shown in the fourth embodiment, then the three-phase clock will be shifted in phase gradually, starting at time $t_3$.

The fifth embodiment provides the same advantages as the third embodiment or fourth embodiment, with the additional advantage of reduced power dissipation, because the controller 2-1B,C-3 operates at a lower frequency.

Variations

The input clock signal φ can be generated by a delay-locked loop (DLL) instead of a phase-locked loop. Since a delay-locked loop also locks an output clock signal in phase to an input reference clock signal, a delay-locked loop can be considered as a type of phase-locked loop. In the appended claims, the term 'phase-locked loop' should be understood to include delay-locked loops.

As noted in the first embodiment, voltage-controlled NOR gates that always operate as inverters can be replaced by voltage-controlled inverters, provided the voltage-controlled inverters have the same propagation delay characteristics as the voltage-controlled NOR gates they replace.

The voltage-controlled NOR gates in the voltage controlled delay lines in the first and second embodiments can be replaced by voltage-controlled NAND) gates. The AND gates, or voltage-controlled AND gates, must then be replaced by OR gates, or voltage-controlled OR gates. The polarity of the clock phase selection signal and delay switching signal must be inverted, and modifications in the content of these signals should be synchronized with low-to-high transitions of the input clock signal φ.

Similarly, in the third to fifth embodiments, the voltage-controlled NOR gates in the ring oscillator in the direct phase controlled VCO can be replaced by NAND gates, if the AND gates or voltage-controlled AND gates are replaced by OR gates or voltage-controlled OR gates, the polarities of the clock phase selection signal and delay switching signal are inverted, and these signals are modified in synchronization with low-to-high transitions of the input clock signal.

The clock/data recovery circuits are not limited to the use of three-phase clock signals to detect conditions requiring the recovered clock phase to be advanced or delayed. Five-phase clock signals, or clock signals with more than five phases, can be employed, so that different necessary amounts of advance or delay can also be detected. The phase can then be shifted by the necessary amount in a single operation. In connection with this variation, the number of stages in the voltage-controlled delay line or direct phase controlled V(CO can also be varied, as noted earlier.

When a direct, phase controlled VCO is employed, the number of stages can be an even number, if logic gates with differential voltage control of the propagation delay are used.

Those skilled in the art will recognize that further variations are possible within the scope claimed below.

What is claimed is:

1. A voltage-controlled delay line for delaying an externally generated input clock signal according to a control voltage signal and a phase selection signal, comprising:

a first cascaded series of first logic gates with voltage-controlled propagation delays, the propagation delays of said first logic gates being controlled in common by said control voltage signal; and a plurality of second logic gates receiving said input clock signal, one second logic gate being coupled to every M-th first logic gate in said first cascaded series, M being a positive integer, each of said second logic gates being independently controllable by said phase selection signal, said input clock signal being supplied to one of said first logic gates through one of said second logic gates, as selected by said phase selection signal, and output as a delayed clock signal from a last one of said first logic gates in said first cascaded series.

2. The voltage-controlled delay line of claim 1, wherein said second logic gates also have voltage-controlled propagation delays, further comprising:

a plurality of delay switching circuits providing control voltages to respective second logic gates, responsive to said control voltage signal and a delay switching signal, thereby switching the propagation delays of respective second logic gates between a first value and a second value, said first value being a minimum value, said second value being equal to M times the propagation delays of said first logic gates, transitions between said first value and said second value being made gradually over a certain transient response interval, said delay switching circuits being independently controllable by said delay switching signal.

3. The voltage-controlled delay line of claim 2, further comprising:

a second cascaded series of third logic gates with voltage-controlled propagation delays, a first one of said third logic gates being coupled to the last one of said first logic gates in said first cascaded series, the propagation delays of said third logic gates also being controlled in common by said control voltage signal and being equal to the propagation delays of said first logic gates, said second cascaded series of third logic gates generating from said delayed clock signal a multiple-phase clock signal with all odd number of phases.

4. The voltage-controlled delay line of claim 1, further comprising:

a second cascaded series of third logic gates with voltage-controlled propagation delays, a first one of said third logic gates being coupled to the last, one of said first logic gates in said first cascaded series, the propagation delays of said third logic gates also being controlled in common by said control voltage signal and being equal to the propagation delays of said first logic gates, said second cascaded series of third logic gates generating from said delayed clock signal a multiple-phase clock signal with an odd number of phases.

5. A clock/data recovery circuit for recovering a clock signal and data from a received data signal, comprising:

the voltage-controlled delay line of claim 4;

a data phase monitor coupled to said voltage-controlled delay line, providing a middle phase of the multiple-phase clock signal generated by said voltage-controlled delay line as a recovered clock signal, providing, as recovered data, samples of said received data signal taken at sampling timings determined by said middle phase, comparing transitions of said received data signal with said multiple-phase clock signal, outputting an advance signal when the transitions of said received data signal approach said sampling timings from one direction, and outputting a delay signal when the transitions of said received data signal approach said sampling timings from another direction; and a controller coupled to said voltage-controlled delay line, for modifying said phase selection signal responsive to said advance signal and said delay signal, thereby shifting said multiple-phase clock signal in phase so that said sampling timings move away from the transitions of said received data signal.

6. The clock/data recovery circuit of claim 5, wherein after modifying said phase selection signal, said controller ignores said advance signal and said delay signal for a certain interval of time.

7. The clock/data recovery circuit of claim 5 wherein, when modifying said phase selection signal from a state in which a first, one of said second logic gates supplies said input clock signal to a state in which a second one of said second logic gates supplies said input clock signal, said controller places said phase selection signal, for one cycle of said input clock signal, in a state in which both said first one of said second logic gates and said second one of said second logic gates supply said input clock signal.

8. The clock/data recovery circuit. of claim 5, wherein said second logic gates also have voltage-controlled propagation delays, and said controller also generates a delay switching signal, further comprising:

a plurality of delay switching circuits providing control voltages to respective second logic gates, responsive to said control voltage signal and said delay switching signal, thereby switching the propagation delays of respective second logic gates between a first value and a second value, said first value being a minimum value, said second value being equal to M times the propagation delays of said first logic gates, transitions between said first value and said second value being made gradually over a certain transient response interval, said delay switching circuits being independently controllable by said delay switching signal.

9. The clock/data recovery circuit of claim 8, wherein:

when said data phase monitor does not output said advance signal and does not output said delay signal, said controller sets said phase selection signal and said delay switching signal so that, if said input clock signal is being supplied through a first one of said second logic gates, said first one of said second logic gates has a propagation delay equal to said first value, and a second one of said second logic gates has a propagation delay equal to said second value;

upon receiving said advance signal, said controller modifies said phase selection signal, thereby causing said input clock signal to be supplied through said second one of said second logic gates, then modifies said delay switching signal, thereby shortening the propagation delay of said second one of said second logic gates from said second value to said first value; and upon receiving said delay signal, said controller modifies said delay switching signal, thereby lengthening the propagation delay of said first one of said second logic gates from said first value to said second value, waits for said transient response interval, then modifies said phase selection signal, causing said input clock signal to be supplied through a third one of said second logic gates, having a propagation delay equal to said first value.

10. The clock/data recovery circuit of claim 9 wherein:

when modifying said phase selection signal in response to said advance signal, said controller places said phase selection signal, for one cycle of said input clock signal, in a state in which both said first one of said second logic gates and said second one of said second logic gates supply said input clock signal; and when modifying said phase selection signal in response to said delay signal, said controller places said phase selection signal, for one cycle of said input clock signal, in a state in which both said first one of said second logic gates and said third one of said second logic gates supply said input clock signal.

11. A clock/data recovery apparatus, comprising:

at least one clock/data recovery circuit of the type in claim 5; and a phase-locked loop coupled to said clock/data recovery circuit, having a loop filter generating said control voltage signal, and a voltage-controlled ring oscillator in which a plurality of fourth logic gates with voltage-controlled propagation delays are coupled in a ring, the propagation delays of said fourth logic gates being controlled by said control voltage signal, said input clock signal being obtained from an output terminal of one of said fourth logic gates.

12. The clock/data recovery apparatus of claim 11, wherein said first logic gates, said third logic gates, and said fourth logic gates are all of identical type.

13. The clock/data recovery apparatus of claim 11, wherein after modifying said phase selection signal, said controller ignores said advance and delay signals for a certain interval of time.

14. The clock/data recovery apparatus of claim 11 wherein, when modifying said phase selection signal from a state in which a first one of said second logic gates supplies said input clock signal to a state in which a second one of said second logic gates supplies said input clock signal, said controller places said phase selection signal, for one cycle of said input clock signal, in a state in which both said first one of said second logic gates and said second one of said second logic gates supply said input clock signal.

15. The clock/data recovery apparatus of claim 11, wherein said second logic gates also have voltage-controlled propagation delays, and said controller also generates a delay switching signal, further comprising:

a plurality of delay switching circuits providing control voltages to respective second logic gates, responsive to said control voltage signal and said delay switching signal, thereby switching the propagation delays of respective second logic gates between a first value and a second value, said first value being a minimum value, said second value being equal to M times the propagation delays of said first logic gates, transitions between said first value and said second value being made gradually over a certain transient response interval, said delay switching circuits being independently controllable by said delay switching signal.

16. The clock/data recovery apparatus of claim 15, wherein:

when said data phase monitor does not, output said advance signal and does not output said delay signal, said controller sets said phase selection signal and said delay switching signal so that, if said input clock signal is being supplied through a first one of said second logic gates, said first one of said second logic gates has a propagation delay equal to said first value, and a second one of said second logic gates has a propagation delay equal to said second value;

upon receiving said advance signal, said controller modifies said phase selection signal, thereby causing said input clock signal to be supplied through said second one of said second logic gates, then modifies said delay switching signal, thereby shortening the propagation delay of said second one of said second logic gates from said second value to said first value; and upon receiving said delay signal, said controller modifies said delay switching signal, thereby lengthening the propagation delay of said first one of said second logic gates from said first value to said second value, waits for said transient response interval, then modifies said phase selection signal, causing said input clock signal to be supplied through a third one of said second logic gates, having a propagation delay equal to said first value.

17. The clock/data recovery apparatus of claim 16 wherein:

when modifying said phase selection signal in response to said advance signal, said controller places said phase selection signal, for one cycle of said input clock signal, in a state in which both said first one of said second logic gates and said second one or said second logic gates supply said input clock signal; and when modifying said phase selection signal in response to said delay signal, said controller places said phase selection signal, for one cycle of said input clock signal, in a state in which both said first one of said second logic gates and said third one of said second logic gates supply said input clock signal.

18. A direct phase controlled voltage-controlled oscillator receiving an externally generated input clock signal, a control voltage signal, and a phase selection signal, comprising:

a plurality of first logic gates with voltage-controlled propagation delays, said first logic gates being coupled in a ring, the propagation delays of said first logic gates being controlled in common by said control voltage signal; and a plurality of second logic gates coupled to respective first logic gates, each of said second logic gates being independently controllable by said phase selection signal, said input clock signal being supplied to one of said first logic gates through one of said second logic gates, as selected by said phase selection signal.

19. The direct phase controlled voltage-controlled oscillator of claim 18, wherein said second logic gates also have voltage-controlled propagation delays, further comprising:

a plurality of delay switching circuits providing control voltages to respective second logic gates, responsive to said control voltage signal and a delay switching signal, thereby switching the propagation delays of respective second logic gates between a first, value and a second value, said first value being a minimum value, said second value being a certain multiple of the propagation delays of said first, logic gates, transitions between said first value and said second value being made gradually over a certain transient response interval, said delay switching circuits being independently controllable by said delay switching signal.

20. A clock/data recovery circuit for recovering a clock signal and data from a received data signal, comprising:

the direct phase controlled voltage-controlled oscillator of claim 18, outputting a multiple-phase clock signal obtained from output terminals of an odd number, greater than one, of said first logic gates;

a data phase monitor coupled to said direct phase controlled voltage-controlled oscillator, providing a middle phase of the multiple-phase clock signal output by said direct phase controlled voltage-controlled oscillator as a recovered clock signal, providing, as recovered data, samples of said received data signal taken at sampling timings determined by said middle phase, comparing transitions of said received data signal with said multiple-phase clock signal, outputting an advance signal when the transitions of said received data signal approach said sampling timings from one direction, and outputting a delay signal when the transitions of said received data signal approach said sampling timings from another direction; and a controller coupled to said direct phase controlled voltage-controlled oscillator, for modifying said phase selection signal responsive to said advance signal and said delay signal, thereby shifting said multiple-phase clock signal in phase so that said sampling timings move away from the transitions of said received data signal.

21. The clock/data recovery circuit of claim 20, wherein after modifying said phase selection signal, said controller ignores said advance signal and said delay signal for a certain interval of time.

22. The clock/data recovery circuit of claim 20, wherein said second logic gates also have voltage-controlled propagation delays, and said controller also generates a delay switching signal, further comprising:

a plurality of delay switching circuits providing control voltages to respective second logic gates, responsive to said control voltage signal and said delay switching signal, thereby switching the propagation delays of respective second logic gates between a first value and a second value, said first value being a minimum value, said second value being a certain multiple of the propagation delays of said first logic gates, transitions between said first value and said second value being made gradually over a certain transient response interval, said delay switching circuits being independently controllable by said delay switching signal.

23. The clock/data recovery circuit of claim 22, wherein:

when said data phase monitor does not output said advance signal and does not output said delay signal, said controller sets said phase selection signal and said delay switching signal so that, if said input clock signal is being supplied through a first one of said second logic gates, said first one of said second logic gates has a propagation delay equal to said first value, and a second one of said second logic gates has a propagation delay equal to said second value;

upon receiving said advance signal, said controller modifies said phase selection signal, thereby causing said input clock signal to be supplied through said second one of said second logic gates, then modifies said delay switching signal, thereby shortening the propagation delay of said second one of said second logic gates from said second value to said first value; and upon receiving said delay signal, said controller modifies said delay switching signal, thereby lengthening the propagation delay of said first one of said second logic gates from said first value to said second value, then modifies said phase selection signal, causing said input clock signal to be stippled through a third one of said second logic gates, having a propagation delay equal to said first value.

24. A clock/data recovery apparatus, comprising:

at least one clock/data recovery circuit of the type in claim 20; and a phase-locked loop having a loop filter generating said control voltage signal, and a voltage-controlled ring oscillator in which a plurality of fourth logic gates with voltage-controlled propagation delays are coupled in a ring, the propagation delays of said fourth logic gates being controlled by said control voltage signal, said input clock signal being obtained from an output terminal of one of said fourth logic gates.

25. The clock/data recovery apparatus of claim 24, wherein said first logic gates, said third logic gates, and said fourth logic gates are all of identical type.

26. The clock/data recovery apparatus of claim 24, further comprising:

a pulse-deleting frequency divider coupled between said phase-locked loop and said clock/data recovery circuit, for reducing said input clock signal in frequency by deleting pulses from said input clock signal, thereby reducing an operating frequency of said controller.

27. The clock/data recovery apparatus of claim 24, wherein after modifying said phase selection signal, said controller ignores said advance signal and said delay signal for a certain interval of time.

28. The clock/data recovery apparatus of claim 24, wherein said second logic gates also have voltage-controlled propagation delays, and said controller also controls generates a delay switching signal, further comprising:

a plurality of delay switching circuits providing control voltages to respective second logic gates, responsive to said control voltage signal and said delay switching signal, thereby switching the propagation delays of respective second logic gates between a first value and a second value, said first value being a minimum value, said second value being a certain multiple of the propagation delays of said first logic gates, transitions between said first value and said second value being made gradually over a certain transient response interval, said delay switching circuits being independently controllable by said delay switching signal.

29. The clock/data recovery apparatus of claim 28, wherein:

when said data phase monitor does not output said advance signal and does not output said delay signal, said controller sets said phase selection signal and said delay switching signal so that, if said input clock signal is being supplied through a first one of said second logic gates, said first one of said second logic gates has a propagation delay equal to said first value, and a second one of said second logic gates has a propagation delay equal to said second value;

upon receiving said advance signal, said controller modifies said phase selection signal, thereby causing said input clock signal to be supplied through said second one of said second logic gates, then modifies said delay switching signal, thereby shortening the propagation delay of said second one of said second logic gates from said second value to said first value; and upon receiving said delay signal, said controller modifies said delay switching signal, thereby lengthening the propagation delay of said first one of said second logic gates from said first value to said second value, then modifies said phase selection signal, causing said input clock signal to be supplied through a third one of said second logic gates, having a propagation delay equal to said first value.

* * * * *